(12) United States Patent
Marakhtanov et al.

(10) Patent No.: US 12,387,909 B2
(45) Date of Patent: Aug. 12, 2025

(54) LOW FREQUENCY RF GENERATOR AND ASSOCIATED ELECTROSTATIC CHUCK

(71) Applicant: Lam Research Corporation, Fremont, CA (US)

(72) Inventors: Alexei M. Marakhtanov, Albany, CA (US); Felix Leib Kozakevich, Sunnyvale, CA (US); Bing Ji, Pleasanton, CA (US); Ranadeep Bhowmick, San Jose, CA (US); John Patrick Holland, San Jose, CA (US); Alexander Matyushkin, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 145 days.

(21) Appl. No.: 18/011,062

(22) PCT Filed: Nov. 5, 2021

(86) PCT No.: PCT/US2021/058357
§ 371 (c)(1),
(2) Date: Dec. 16, 2022

(87) PCT Pub. No.: WO2022/125231
PCT Pub. Date: Jun. 16, 2022

(65) Prior Publication Data
US 2023/0274914 A1    Aug. 31, 2023

Related U.S. Application Data

(60) Provisional application No. 63/164,450, filed on Mar. 22, 2021, provisional application No. 63/122,659, filed on Dec. 8, 2020.

(51) Int. Cl.
*H01J 37/32* (2006.01)
*H01L 21/683* (2006.01)

(52) U.S. Cl.
CPC .. *H01J 37/32183* (2013.01); *H01J 37/32165* (2013.01); *H01J 37/32642* (2013.01);
(Continued)

(58) Field of Classification Search
CPC .......... H01J 37/32091; H01J 37/32715; H01J 37/32183; H01J 37/32165;
(Continued)

(56) References Cited

U.S. PATENT DOCUMENTS

2009/0284156 A1* 11/2009 Banna ............... H01J 37/32155
315/111.21
2018/0025891 A1* 1/2018 Marakhtanov .... H01J 37/32568
438/714

(Continued)

OTHER PUBLICATIONS

"Nomenclature of the Frequency and Wavelength Bands Used in Telecommunications" Oct. 2013 (Year: 2013).*
ISR & WO PCT/US2021/058357, dated Feb. 15, 2022, 11 pages.

*Primary Examiner* — Kevin J Comber
(74) *Attorney, Agent, or Firm* — PENILLA IP, APC

(57) ABSTRACT

A system having the low frequency RF generator is described. The low frequency RF has an operating frequency range between 10 kilohertz (kHz) and 330 kHz. The low frequency RF generator generates an RF signal. The system further includes an impedance matching circuit coupled to the low frequency RF generator for receiving the RF signal. The impedance matching circuit modifies an impedance of the RF signal to output a modified RF signal. The system includes a plasma chamber coupled to the RF generator for receiving the modified RF signal. The plasma chamber includes a chuck having a dielectric layer and a base metal layer. The dielectric layer is located on top of the base metal layer. The dielectric layer has a bottom surface, and the base metal layer has a top surface. The base metal layer has a (Continued)

porous plug and the bottom surface of the dielectric layer has a portion that is in contact with the porous plug.

20 Claims, 14 Drawing Sheets

(52) U.S. Cl.
CPC . *H01J 37/32715* (2013.01); *H01J 2237/2007* (2013.01); *H01J 2237/334* (2013.01); *H01L 21/6833* (2013.01)

(58) Field of Classification Search
CPC ....... H01J 37/32642; H01J 2237/67109; H01J 2237/6833; H01L 21/67109; H01L 21/6833
USPC ......................................................... 361/234
See application file for complete search history.

(56) References Cited

U.S. PATENT DOCUMENTS

| | | |
|---|---|---|
| 2020/0013595 A1 | 1/2020 | Lee et al. |
| 2020/0075290 A1 | 3/2020 | Kawasaki et al. |
| 2020/0286717 A1* | 9/2020 | Cho .................. H01J 37/32724 |

* cited by examiner (100kHz RFG)

(100kHz RFG)

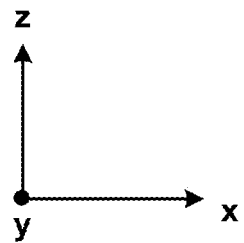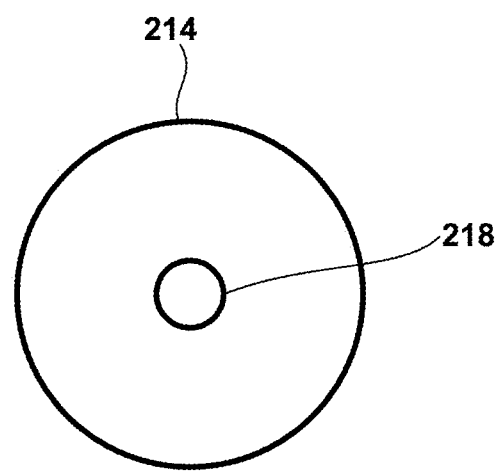
FIG. 3

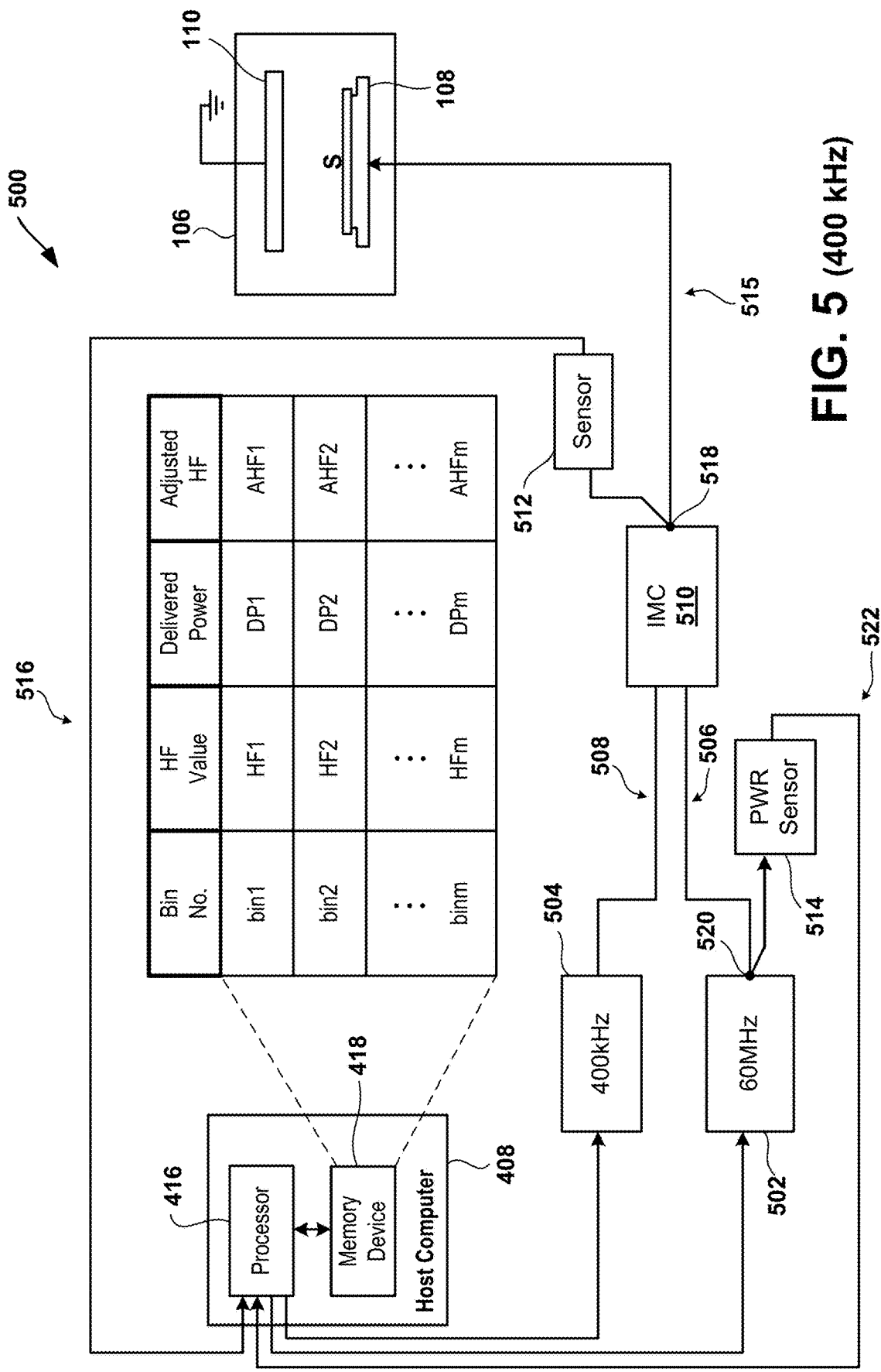
FIG. 5 (400 kHz)

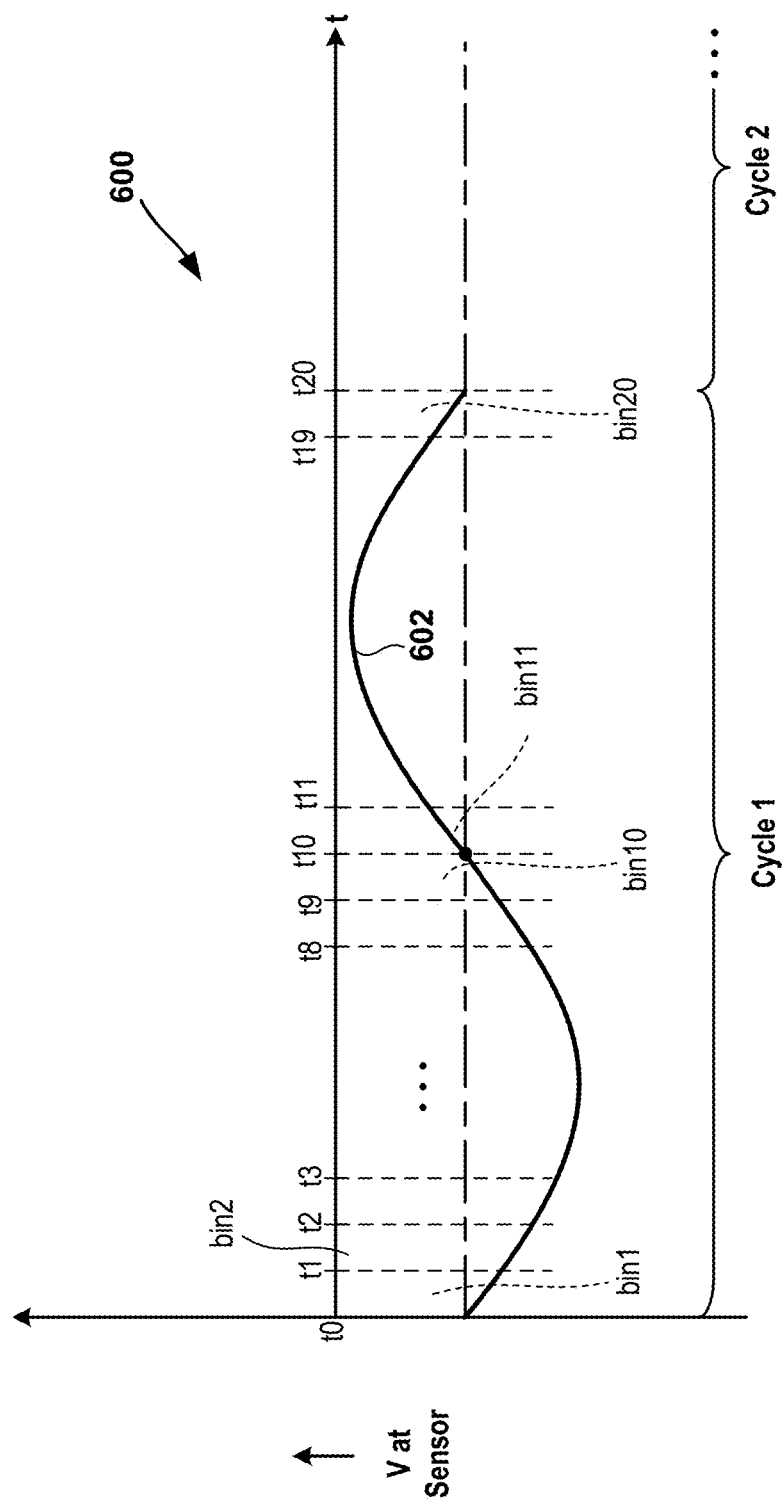
FIG. 6 (400 kHz)

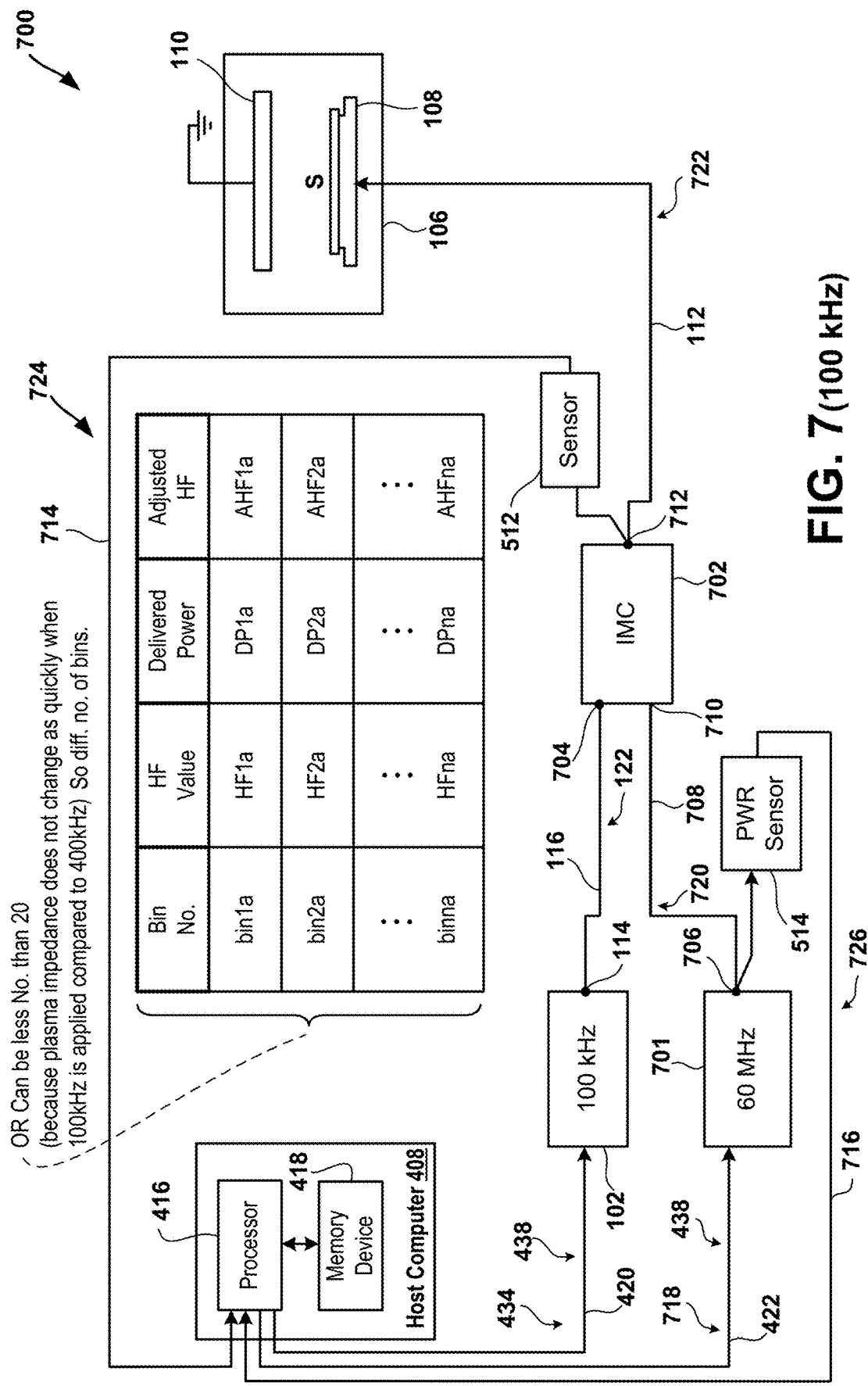
FIG. 7 (100 kHz)

(100 kHz – Bins increased OR decreased when freq. is decreased from 400 kHz to 100 kHz)

(Increased V for For Same Power)

LOW FREQUENCY RF GENERATOR AND ASSOCIATED ELECTROSTATIC CHUCK

CLAIM OF PRIORITY

This application is a national stage filing of and claims priority, under 35 U.S.C. § 371, to PCT/US21/58357, filed on Nov. 5, 2021, and titled "LOW FREQUENCY RF GENERATOR AND ASSOCIATED ELECTROSTATIC CHUCK", which claims the benefit of and priority, under 35 U.S.C. § 119 (e), to U.S. Provisional Patent Application No. 63/164,450, filed on Mar. 22, 2021, and titled "LOW FREQUENCY RF GENERATOR AND ASSOCIATED ELECTROSTATIC CHUCK", and to U.S. Provisional Patent Application No. 63/122,659, filed on Dec. 8, 2020, and titled "LOW FREQUENCY RF GENERATOR AND ASSOCIATED ELECTROSTATIC CHUCK", all of which are incorporated by reference herein in their entirety.

FIELD

The present embodiments relate to systems and methods for using a low frequency radio frequency (RF) generator and associated electrostatic chuck.

BACKGROUND

In a plasma tool, multiple radio frequency (RF) generators are used. A first RF generator is coupled to a match. Also, a second RF generator is coupled to the match. An output of the match is coupled to a plasma chamber. A substrate is placed within the plasma chamber.

The RF generators generate RF signals, which are supplied via the match to the plasma chamber to process the substrate. However, to generate the RF signals, a high amount of power is consumed by the RF generators. In addition, the RF generators do not facilitate in achieving an etch rate for etching the substrate. Also, some components of the plasma chamber deteriorate over time causing issues during processing of the substrate.

It is in this context that embodiments described in the present disclosure arise.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Embodiments of the disclosure provide systems, apparatus, methods and computer programs for using a low frequency radio frequency (RF) generator and associated electrostatic chuck. It should be appreciated that the present embodiments can be implemented in numerous ways, e.g., a process, an apparatus, a system, a device, or a method on a computer readable medium. Several embodiments are described below.

In one embodiment, a system having the low frequency RF generator is described. The low frequency RF has an operating frequency range between 10 kilohertz (kHz) and 330 kHz. The low frequency RF generator generates an RF signal. The system further includes an impedance matching circuit coupled to the low frequency RF generator for receiving the RF signal. The impedance matching circuit modifies an impedance of the RF signal to output a modified RF signal. The system includes a plasma chamber coupled to the RF generator for receiving the modified RF signal. The plasma chamber includes a chuck having a dielectric layer and a base metal layer. The dielectric layer is located on top of the base metal layer. The dielectric layer has a bottom surface, and the base metal layer has a top surface. The base metal layer has a porous plug and the bottom surface of the dielectric layer has a portion that is in contact with the porous plug.

In an embodiment, a plasma chamber is described. The plasma chamber includes a top electrode. The plasma chamber further includes an electrostatic chuck facing the top electrode. The chuck includes a dielectric layer having a bottom surface. The chuck also includes a base metal layer having a top surface. The dielectric layer is located on top of the base metal layer and the base metal layer has a porous plug. The bottom surface of the dielectric layer has a portion that is in contact with the porous plug. The chuck can be coupled to an RF transmission line to receive a modified RF signal having a frequency that ranges between 10 kHz and 330 kHz.

In one embodiment, a method is described. The method includes generating an RF signal. The RF signal is generated by an RF generator that has an operating frequency range between 10 kHz and 330 kHz. The method further includes modifying an impedance of the RF signal to output a modified RF signal. The method includes receiving, by a lower electrode, the modified RF signal. The modified RF signal is received via a base metal layer of a chuck and a portion of a dielectric layer of the chuck. The dielectric layer is located on top of the base metal layer and has a bottom surface. The base metal layer has a porous plug. The bottom surface of the dielectric layer has a portion that is in contact with the porous plug.

Some advantages of the herein described low frequency RF generator include generating a higher amount of voltage compared to that generated by a high frequency RF generator. For the same amount of power that is provided to the low and high frequency RF generators, the low frequency RF generator outputs the higher amount of voltage. Also, the low frequency RF generator generates an RF signal that is supplied to a plasma chamber to generate plasma. Ions of the plasma has a greater vertical directionality compared to plasma ions generated using the high frequency RF generator. The vertical directions of plasma ions facilitate increase a processing rate, such as a rate of etching a substrate.

Additional advantages of the herein described chuck includes that a dielectric layer of the chuck excludes any porous plugs. The porous plugs deteriorate over time and may lead to increased chances of arcing of plasma and ignition of a coolant gas. By removing the porous plugs from the dielectric layer, chances of arcing and ignition of the coolant gas are reduced.

Further advantages of the herein described systems and methods include increasing an amount of power delivered to the plasma chamber. When the low frequency RF generator is used instead of the high frequency RF generator, a different number of bins are used to control frequency another high frequency RF generator during a cycle of operation of the low frequency RF generator. By using the different number of bins, the delivered power is increased.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 3 is a top view of an embodiment of a porous plug used within the chuck of FIG. 2A.

FIG. 5 is a diagram of an embodiment of a system to illustrate a method for adjusting a frequency of an RF signal generated by a higher frequency RF generator during a cycle of an RF signal generated by a high frequency RF generator.

FIG. 6 is an embodiment of a graph to illustrate a voltage signal.

FIG. 7 is a diagram of an embodiment of a system to illustrate binning for the RF generator of FIG. 1A.

DETAILED DESCRIPTION

The following embodiments describe systems and methods for using a low frequency radio frequency (RF) generator and associated electrostatic chuck. It will be apparent that the present embodiments may be practiced without some or all of these specific details. In other instances, well known operations have not been described in detail in order not to unnecessarily obscure the present embodiments.

Figure 1A:
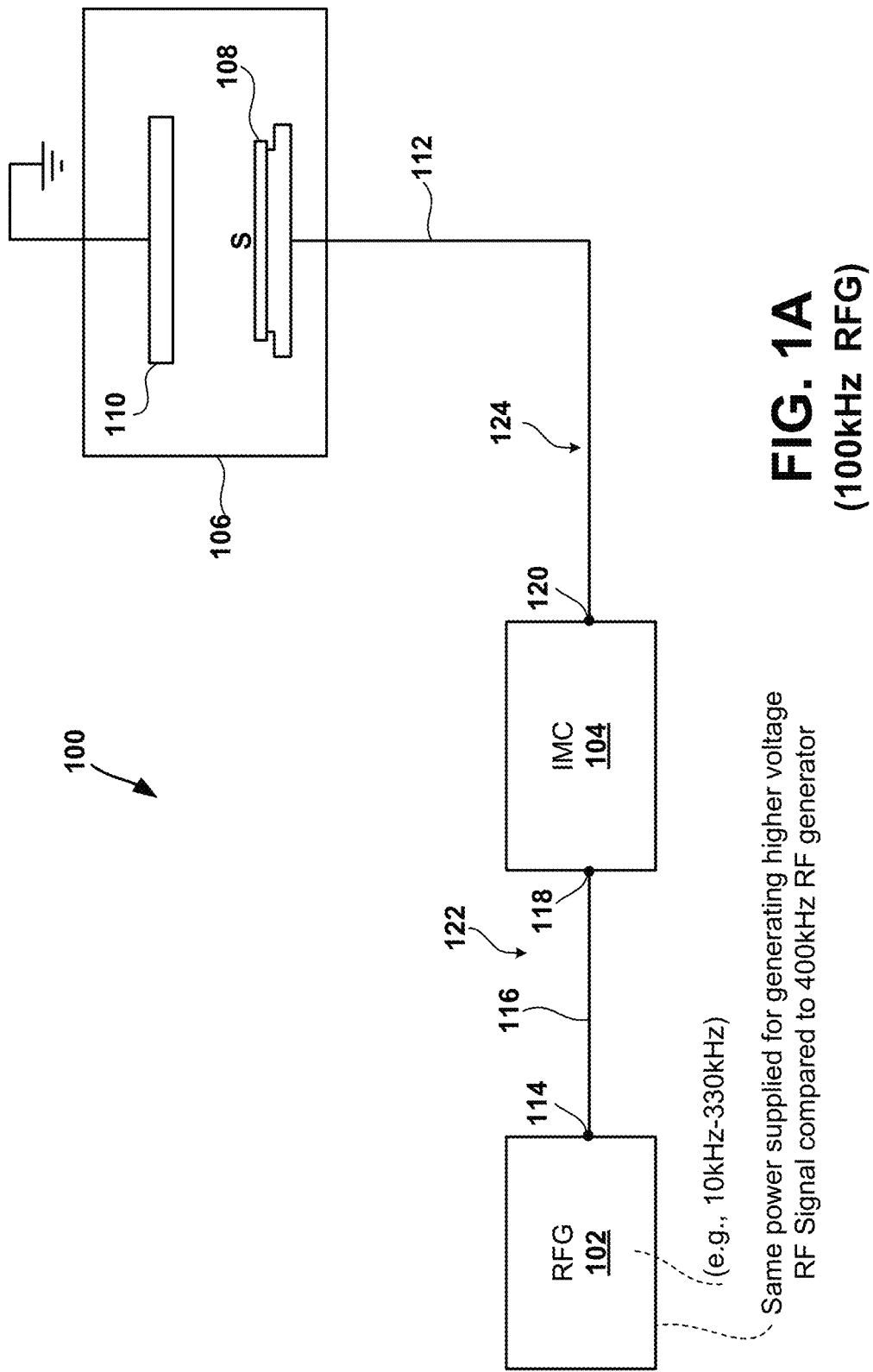
FIG. 1A is a diagram of an embodiment of a system to illustrate a low frequency radio frequency (RF) generator.

FIG. 1A is a diagram of an embodiment of a system 100 to illustrate a low frequency RF generator 102. The system 100 includes the RF generator 102, an impedance matching circuit (IMC) 104, and a plasma chamber 106, which is an example of a capacitively coupled (CCP) plasma chamber. As an example, the RF generator 102 is a low frequency RF generator that has an operating frequency ranging from and including 10 kilohertz (kHz) to 330 kHz. To illustrate, the RF generator 102 has a frequency of operation of 100 kHz. To further illustrate, the RF generator 102 operates at a frequency ranging from 90 kHz to 110 kHz. As another further illustration, the RF generator 102 is tune to operate in a frequency ranging from 90 kHz to 110 kHz. As another illustration, the RF generator 102 has a frequency of operation of 110 kHz.

Examples of an impedance matching circuit, as used herein, include a network of circuit components, such as inductors, resistors, capacitors. To illustrate, the impedance matching circuit has one or more series circuits and one or more shunt circuits. Each series circuit includes one or more inductors and one or more capacitors that are coupled in series with each other. Similarly, each shunt circuit includes one or more inductors and one or more capacitors that are coupled in series with each other, and one of the one or more inductors and the one or more capacitors is coupled to a ground potential. Each of the one or more shunt circuits is coupled to a corresponding one of the one or more series circuits. The terms impedance matching circuit, match, and impedance matching network are used herein interchangeably.

The plasma chamber 106 includes a substrate support 108, such as a chuck, and an upper electrode 110. As an example, the upper electrode 110 is fabricated from aluminum or an alloy of aluminum or silicon. The upper electrode 110 is sometimes referred to herein as a top electrode. An example of the plasma chamber 106 is a capacitively coupled plasma (CCP) chamber. The chuck can be an electrostatic chuck. The electrostatic chuck, upon receiving a direct current (DC) voltage, generates an attracting force between an electrostatic electrode of the electrostatic chuck and a substrate S. The substrate S, such as a semiconductor wafer, is placed on a top surface of the substrate support 108. The substrate support 108 is situated below the upper electrode 110 to form a gap between the substrate support 108 and the upper electrode 110.

An output 114 of the RF generator 102 is coupled via an RF cable 114 to an input 118 of the impedance matching circuit 104 and an output 120 of the impedance matching circuit 104 is coupled via an RF transmission line 112 to a lower electrode of the substrate support 108. As an example, an output of a component of a system, described herein, is an output port of the component and an input of the component is an input port of the component. To illustrate, the output 114 is an output port of the RF generator 102 and the input 118 is an input port of the impedance matching circuit 104. The upper electrode 110 is coupled to a ground potential, such as a zero potential or a reference potential.

An example of an RF transmission line includes a combination of an RF rod, an RF cylinder, and the electrostatic chuck. An insulator material is placed between the RF rod and a wall of an RF tunnel. The RF tunnel surrounds the insulator material that surrounds the RF rod. Also, the RF cylinder is coupled to the RF rod via an RF strap. An RF plasma sheath surrounds the electrostatic chuck when plasma is generated within the plasma chamber 106. In one embodiment, the electrostatic chuck is not a part of the RF transmission line.

The RF generator 102 generates an RF signal 122 and supplies the RF signal 122 at the output 114. The RF signal 122 is transferred via the RF cable 116 to the input 118. The impedance matching circuit 104 matches an impedance of a load coupled to the output 120 with an impedance of a source coupled to the input 118 to modify an impedance of the RF signal 122 to output a modified RF signal 124. An example of the load coupled to the output 120 includes the RF transmission line 112 and the plasma chamber 106. An example of the source coupled to the input 118 includes the RF cable 116 and the RF generator 102. The modified RF signal 124 is transferred from the output 120 via the RF transmission line 112 to the lower electrode of the substrate support 108. It should be noted that a frequency of each of the RF signal 122 and the modified RF signal 124 is the same as the frequency of operation of the RF generator 102.

When one or more process gases, such as an oxygen containing gas, or a fluorine containing gas, or a hydrogen containing gas, or a combination thereof, is supplied to the gap within the plasma chamber 106 and the modified RF signal 124 is supplied to the lower electrode of the substrate support 108, plasma is stricken or maintained within the plasma chamber 106. The plasma is used to process the substrate S. For example, one or more materials are deposited on a top surface of the substrate S. As another example, the substrate S is etched. As yet another example, the substrate S is cleaned.

Figure 1B:
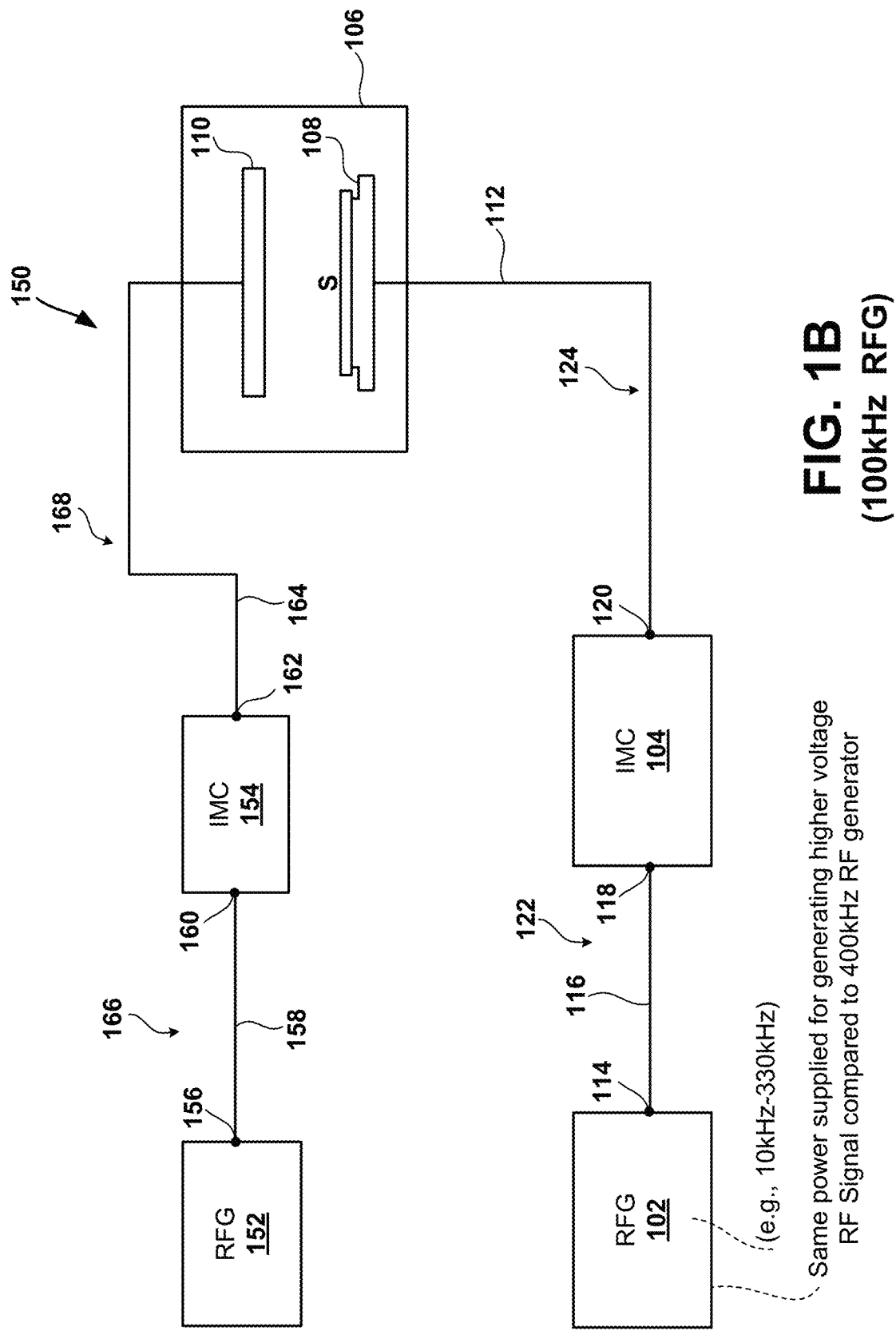
FIG. 1B is a diagram of an embodiment of a system to illustrate the low frequency radio frequency (RF) generator in use with a megahertz (MH)z RF generator.

FIG. 1B is a diagram of an embodiment of a system 150 to illustrate use of the RF generator 102 with an RF generator 152. The system 150 includes the RF generator 152 and an IMC 154.

The RF generator 152 has a frequency of operation of 60 MHz. For example, the RF generator 152 can be tuned to operate between 54 MHz and 63 MHz. The RF generator 152 has an output 156 that is coupled via an RF cable 158 to an input 160 of the IMC 154. The IMC 154 has an output 162 that is coupled via an RF transmission line 164 to the upper electrode 110.

The RF generator 156 generates an RF signal 166, which is supplied via the output 156 and the RF cable 158 to the input 160 of the IMC 154. The IMC 154 matches an impedance of a load coupled to the output 162 with an impedance of a source coupled to the input 160. An example of the load coupled to the output 162 is a combination of the RF transmission line 164 and the plasma chamber 106. An example of the source coupled to the input 160 is an combination of the RF generator 152 and the RF cable 158. The impedance matching is performed to modify an impedance of the RF signal 166 to provide a modified RF signal 168 at the output 162. The modified RF signal 168 is supplied via the output 162 and the RF transmission line 164 to the upper electrode 110. When the one or more process gases are supplied to the plasma chamber 106 in addition to the modified RF signals 168 and 124, plasma is stricken or maintained within the plasma chamber 106. The plasma processes the substrate S placed within the plasma chamber 106.

Figure 2A:
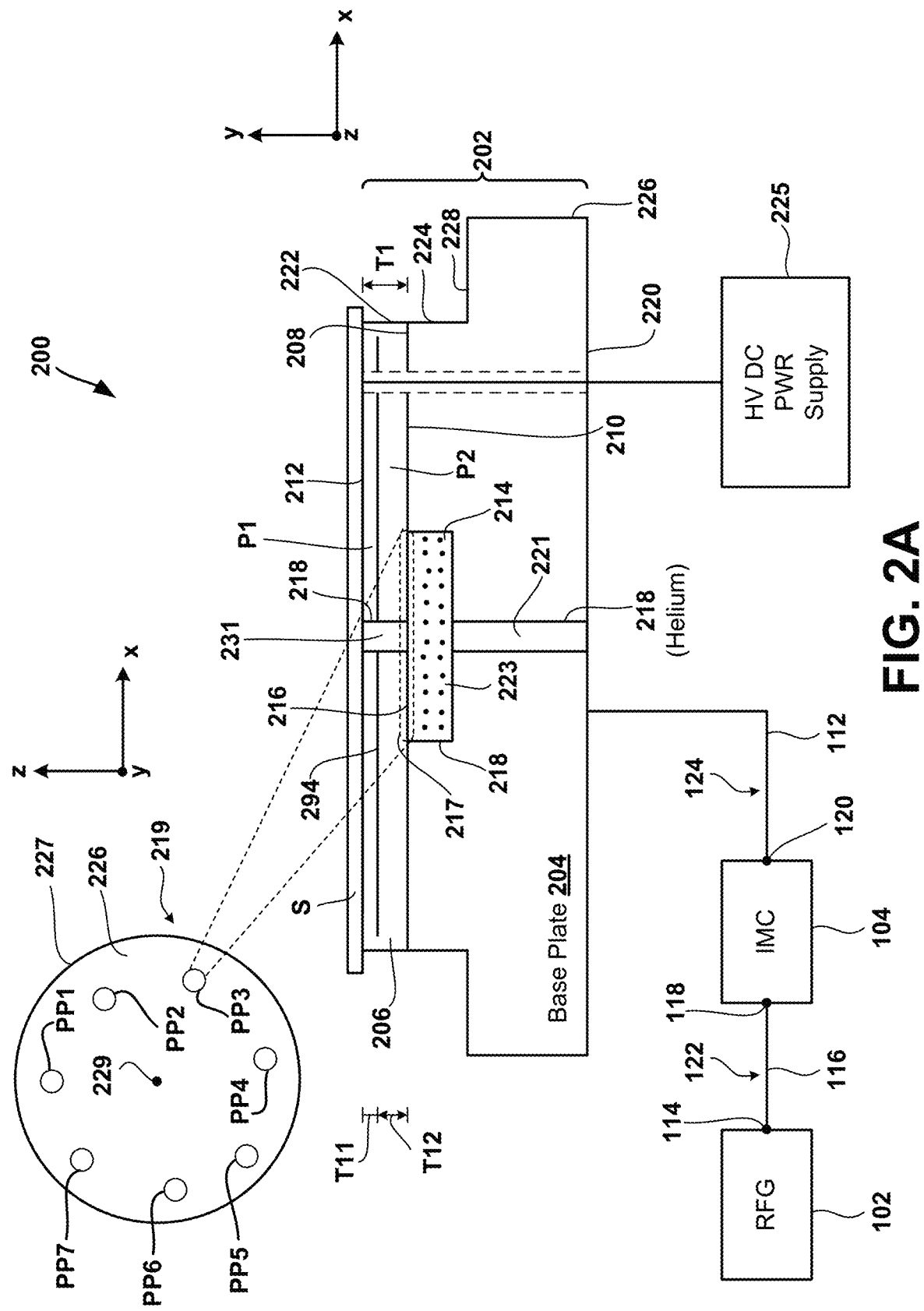
FIG. 2A is a diagram of an embodiment of a system to illustrate a chuck that is used with the RF generator of FIG. 1A.

FIG. 2A is a diagram of an embodiment of a system 200 to illustrate a chuck 202 that is used with the low frequency RF generator 102 of FIG. 1A. The system 200 includes the RF generator 102, the impedance matching circuit 104, and the chuck 202, which is an example of the substrate support 108 (FIG. 1A). The system 200 further includes a high voltage (HV) DC power (PWR) supply 225.

Figure 2B:
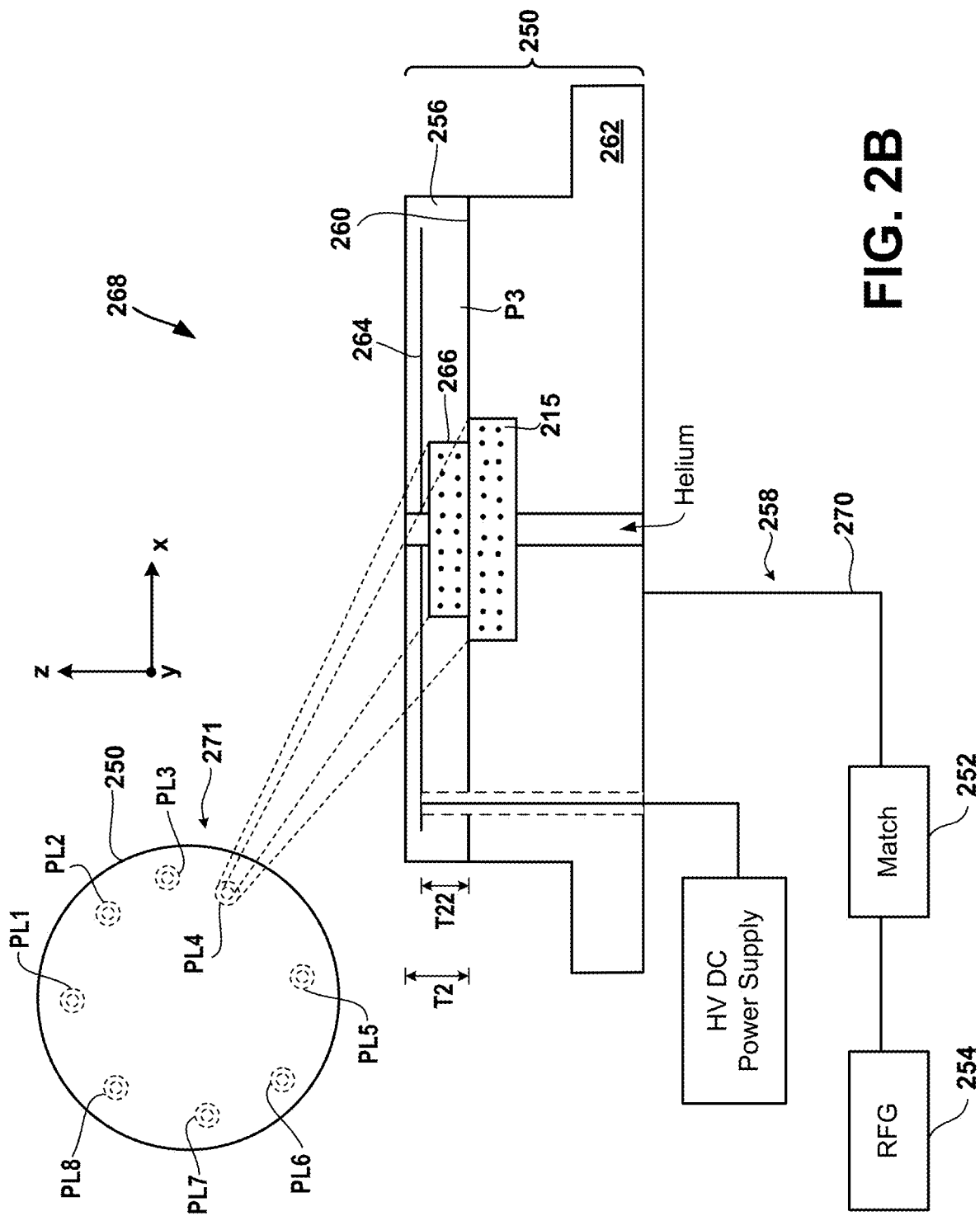
FIG. 2B is a diagram of an embodiment of a system to illustrate use of a porous plug within a dielectric layer of a chuck.

FIG. 2B is a diagram of an embodiment of a system 268 to illustrate use of a porous plug 266 within a dielectric layer 256 of a chuck 250. As an example, a porous plug, as used herein, is made from a dielectric material or an insulator. The system 268 includes a high frequency RF generator 254, a match 252, and the chuck 250. The high frequency RF generator 254 is coupled to the match 252 and the match 252 is coupled via an RF transmission line 270 to the base plate 262 of the chuck 250. The high frequency RF generator 254 has a higher frequency of operation than that of the low frequency RF generator 102 (FIG. 2A). For example, the high frequency RF generator 254 has a frequency of operation of 400 kHz or 2 megahertz (MHz) or 27 MHz or 60 MHz. The system 268 further includes a HV DC power supply. As an example, a frequency of operation of a 400 kHz RF generator ranges from 330 kHz to 440 kHz. To illustrate, a frequency of operation of the 400 kHz RF generator is 330 kHz.

The chuck 250 has a base plate 262 in which multiple porous plugs PL1 through PL8 are embedded. The porous plugs PL1 through PL8 are illustrated in a top view 250 of the chuck 250. One of the porous plugs PL3 is illustrated as a porous plug 215.

With reference back to FIG. 2A, the chuck 202 includes a base plate 204 and a dielectric layer 206. The base plate 204 is fabricated from a conductive metal, such as aluminum or an alloy of aluminum. The dielectric layer 206 is fabricated from a dielectric material or an insulator material, such as ceramic. The base plate 204 is sometimes referred to herein as a base metal layer or a lower electrode.

The dielectric layer 206 is situated on top of and in contact with the base plate 204. For example, a top surface 208 of the base plate 204 is attached to a bottom surface 210 of the dielectric layer 206. The dielectric layer 206 excludes any porous plugs, which are further described below. For example, there is no porous plug, such as the porous plug 266 (FIG. 2B), embedded within the dielectric layer 206. The porous plug 266 is embedded within the thicker dielectric layer 256 (FIG. 2B), such as a ceramic layer. The porous plug 266 results in an increased thickness T2 of the dielectric layer 256 compared to a thickness T1 of the dielectric layer 206. To illustrate, the dielectric layer 206 has the thickness T1 ranging from 0.7 millimeters (mm) to 0.9 mm. The thickness T1 is a height of the dielectric layer 206 from the bottom surface 210 to a top surface 212 of the dielectric layer 206 on which the substrate S is placed. The thickness T1 is less than the thickness T2 (FIG. 2B) of the dielectric layer 256 of the chuck 250 (FIG. 2B) that is coupled via the match 252 (FIG. 2B) to the high frequency RF generator 254 (FIG. 2B). As an example, the thickness T2 is greater than 0.9 mm. To illustrate, the thickness T2 ranges from 1 mm to 1.25 mm.

In addition, the lower thickness T1 reduces a voltage drop to increase an amount of power that is delivered to the chuck 202. For example, the low frequency RF generator 102 generates a high amount of voltage compared to an amount of voltage generated by the high frequency RF generator 254. Further in the example, when the chuck 250 is coupled to the low frequency RF generator 102 via the IMC 104 (FIG. 1A), there is an increase in voltage drop across a height of the dielectric layer 256. Contrarily, in the example, when the chuck 202 is coupled to the low frequency RF generator 102 via the IMC 104, the voltage drop decreases due to a lower height of the dielectric layer 206. Also, in the example, the lower height is less than the height of the dielectric layer 206. Further, in the example, the lower height makes the dielectric layer 206 thinner compared to the dielectric layer 256. Due to the lower voltage drop, there is an increase in an amount of power that is delivered to the substrate S via the chuck 202.

The porous plugs PL1 through PL8 if embedded within the dielectric layer 206 from the bottom surface 210 of the dielectric layer 206 deteriorate over time and therefore, increase chances of arcing of the plasma and ignition of a coolant gas, described below. By using the low frequency RF generator 102 with the chuck 202, no such porous plugs PL1 through PL8 are needed within the dielectric layer 206. As such, chances of arcing within the dielectric layer 206 are reduced to be minimal, such as zero.

The dielectric layer 206 has a side surface 222 having the thickness T1, and the side surface 222 extends from the bottom surface 210 to the top surface 212. In one embodiment, the side surface 222 is annular in shape. As an example, the top surface 212 is perpendicular or substantially perpendicular to the side surface 222 and the side surface 222 is perpendicular or substantially perpendicular to the bottom surface 210. To illustrate, a first surface is considered to be substantially perpendicular to a second surface when an angle between the first and second surfaces ranges between 85° and 95°.

The top surface 212 is located in a direction opposite to a direction in which the bottom surface 210 is located, and the surfaces 212 and 210 are separated from each other by the side surface 222. Each surface 212 and 210 is straight in shape and extends in a horizontal plane, and the side surface 222 is annular in shape.

The base plate 204 includes multiple porous plugs PP1, PP2, PP3, PP4 PP5, PP6, and PP7. An example of the porous plug PP4 is a porous plug 214. As an example, to form each porous plug PP1 through PP7, a ceramic slurry is injected into a plug region, which is a space of a channel 218 formed within the base plate 204. The ceramic slurry can be injected from above the top surface 208 of the base plate 226. The ceramic slurry is injected along with an initiator, or a catalyst, or organic monomers, or a combination thereof. The ceramic slurry includes ceramic particles, water, and a dispersant. The ceramic slurry is then made to produce foam using a foaming agent. After sufficient foaming, the organic monomers form polymers. A gas within the foam then presses against the polymers to form multiple pores of the resulting porous plug PP1, or PP2, or PP3, or PP4, or PP5, or PP6, or PP7. Then, the foamed ceramic is sintered or "fired" to leave behind a pore matrix of the porous plug. The pore matrix is integrally distributed throughout a body of the porous plug.

Continuing with the example, the channel has a narrow region 221, which is followed by a broad region 223, which is further followed by a narrow region 231. For example, the narrow region 231 is adjacent to and lies on top of the broad region 223. The broad region 223 lies on top of and is adjacent to the narrow region 221. Each narrow region 221 and 231 has a smaller diameter than that of the broad region 223. The porous plug PP1, or PP2, or PP3, or PP4, or PP5, or PP6, or PP7 has numerous openings, "cells," or pores that enable the coolant gas, such as helium, to flow through but that also limit a mean free path of the coolant gas while flowing. The narrow channel 231 is formed within the dielectric layer 206 and extends from the bottom surface 210 to the top surface 212 of the dielectric layer 206. To illustrate, narrow regions, such as the narrow region 231, of the channels, such as the channel 218, to transfer the coolant gas surround the embedded HV electrode 294.

The porous plugs PP1 through PP7 are illustrated in a top view 219 of the base plate 226. Each porous plug PP1 through PP7 is embedded within the base plate 204 from the top surface 208 of the base plate 204. For example, a hole is drilled into the top surface 208 to form a volume in which the porous plug 214 is placed to embed the porous plug 214 within the base plate 204. The porous plugs PP1 through PP7 of the base plate 204 interface with, such as are in contact with or adjacent to or next to, the bottom surface 210 of the dielectric layer 206. For example, upper surfaces of the porous plugs PP1 through PP7 of the dielectric layer 206 are in contact with and adjacent to the bottom surface 210. To illustrate, an upper surface 216 of the porous plug 214 is in physical contact with the bottom surface 210 of the dielectric layer 206. To further illustrate, a portion 217 of the bottom surface 210 is in physical contact with the upper surface 216 of the porous plug 214. Similarly, additional portions of the bottom surface 210 are in physical contact with upper surfaces of other porous plugs PP1, PP2, and PP4 through PP7 embedded within the base plate 204.

The porous plugs PP1 through PP7 are located closer to an edge 227, such as a periphery or a circumference, of the base plate 204 compared to a center 229 of the base plate 204. As an example, the porous plugs PP1 through PP7 are located radially with respect to the center 229 of the base plate 204. Any two adjacent ones of the porous plugs PP1 through PP7 are separated by a portion of the top surface 208 of the base plate 226. For example, the porous plugs PP1 through PP7 are located intermittently along the top surface 208.

The chuck 202 includes an embedded HV electrode 294 to clamp the substrate S. The embedded HV electrode 294 is sometimes referred to herein as an electrostatic electrode. An electrostatic electrode is sometimes referred to herein as a clamping electrode. The electrostatic electrode 294 is coupled to the DC HV power supply 225. For example, when the DC HV power supply 225 supplies power to the electrostatic electrode 294, the electrostatic electrode 294 generates the attracting force to clamp the substrate S to the chuck 202 while the substrate S is being processed.

As shown in FIG. 2A, the base plate 204 has a top side surface 224 and a bottom side surface 226. As an example, the top side surface 224 has a smaller diameter compared to a diameter of the bottom side surface 226. Also, as an example, each of the top side surface 224 and the bottom side surface 226 is annular in shape. The top side surface 224 is located on top of the bottom side surface 226 and is perpendicular or substantially perpendicular to the top surface 208 of the base plate 204. A middle surface 228 of the base plate 204 connects the top side surface 224 with the bottom side surface 226. As an example, the middle surface 228 extends in a horizontal direction between the top side surface 224 and the bottom side surface 226. The top surface 208 has a greater height from a bottom surface 220 of the base plate 204 compared to a height of the middle surface 228 from the bottom surface 220. The bottom side surface 226 is perpendicular or substantially perpendicular to the bottom surface 220 of the base plate 204.

The chuck 202 includes multiple channels, such as the channel 218, that extend from the bottom surface 220 of the base plate 204 to the top surface 212 of the dielectric layer 206. For example, the channels extend from the bottom surface 220 to the top surface 208 of the base plate 204 and further extend from the bottom surface 210 of the dielectric layer 206 to the top surface 212 of the dielectric layer 206. An example of a channel within the chuck 202 includes a through hole. As an example, there are 20 to 40 channels within the chuck 202.

The coolant gas, such as Helium (He), is supplied via the channels to a bottom surface of the substrate S for changing thermal conductivity between the chuck 202 and the substrate S. For example, an amount of the coolant gas supplied via the channels is controlled to cool the substrate S or to reduce cooling of the substrate S. As another example, helium, when distributed across a bottom surface of the substrate S, evenly distributes power of the modified RF signal 124 that is applied to the bottom surface of the substrate S. The porous plugs of the base plate 204 reduce an amount of open volume that is occupied by the coolant gas to reduce chances of the coolant gas being ignited by the plasma and to reduce chances of arcing of the plasma. For example, when the porous plug 214 is not used, there is a greater amount of space between each channel and the top surface 208 of the bate plate 204 to create the arcing and increase chances of ignition of the coolant gas.

The dielectric layer 206 includes the electrostatic electrode 294. For example, the electrostatic electrode 294 is embedded within the dielectric layer 222. The electrostatic electrode 294 is located closer to the top surface 212 of the dielectric layer 206 than to the bottom surface 210 of the dielectric layer 206. As an example, a thickness T11 of a portion P1 of the dielectric layer 206 between the electrostatic electrode 294 and the top surface 212 is less than a thickness T12 of another portion P2 of the dielectric layer 206 between the electrostatic electrode 294 and the bottom surface 210 of the dielectric layer 206. A sum of the thicknesses T11 and T12 is equal to the thickness T1 of the dielectric layer 206. The electrostatic electrode 294 is fabricated from a conductive metal, such as aluminum or an alloy of aluminum.

The RF transmission line 112 is coupled to the base plate 204. The modified RF signal 124 is transferred via the RF transmission line 112 to the base plate 204. The modified RF signal 124 reaches the dielectric layer 206, which has the portion P2. The portion P2 acts as a dielectric between the base plate 204 and the electrostatic electrode 294. Also, the portion P1 of the dielectric layer 206 acts as a dielectric between the electrostatic electrode 294 and the substrate S.

A capacitive reactance X1 provided by the portion P2 to the modified RF signal 124 is equal to a ratio of 1 and a product of 2, π, f1, and capacitance C1 of the portion P2, where f1 is a frequency of operation of the RF generator 102, and the capacitance C1 is between the top surface 208 of the base plate 204 and the electrostatic electrode 294. The capacitance C1 is equal to a product of a dielectric constant εo of the portion P2 and a ratio of an area A1 of overlap between the top surface 208 and the electrostatic electrode 294.

It should be noted the capacitive reactance X1 is less than another capacitive reactance X2 of a portion of the dielectric layer 256 (FIG. 2B) of the chuck 250 that is coupled to the high frequency RF generator 254 via the match 252 (FIG. 2B). The capacitive reactance X2 is provided to a modified RF signal 258 that is output from the match 252 between the high frequency RF generator 254 and the dielectric layer 256 of the chuck 250. The capacitive reactance X2 is equal to a ratio of 1 and a product of 2, π, f2, and capacitance C2 of a portion P3 of the dielectric layer 256, where f2 is a frequency of operation of the high frequency RF generator 254, and the capacitance C2 is between a top surface 260 of a base plate 262 (FIG. 2B) of the chuck 250 and an electrostatic electrode 264 (FIG. 2B) embedded within the chuck 250. The capacitance C2 is equal to a product of a dielectric constant εo of the portion P3 and a ratio of an area A2 of overlap between the top surface 260 and the electrostatic electrode 264 (FIG. 2B).

It should be noted that the reactance X1 provided to the modified RF signal 124 is less than the reactance X2 provided to the modified RF signal 258. For example, for the same values of C1 and C2, the reactance X1 is greater than the reactance X2 when the frequency f1 is less than the frequency f2. However, C1 is substantially greater than C2 because given that the area A1 is equal or substantially equal to A2, the thickness T12 between the top surface 208 of the base plate 204 and the electrostatic electrode 294 is less than a thickness T22 between the top surface 260 of the base plate 262 (FIG. 2B) and the electrostatic electrode 264 (FIG. 2B). The areas A1 and A2 are substantially equal when the area A2 is greater than or less than the area A2 by a preset percentage, such as, by 10% or less. The greater capacitance C1 compensates for the decrease in the frequency f1. Because the greater capacitance compensates for the decrease in the frequency f1, there is no need for the porous plugs PL1 through PL8 in the dielectric layer 206 to evenly distribute power of the modified RF signal 124 to the bottom surface of the substrate S. When C1 is substantially greater than C2, the reactance X1 becomes less than the reactance X2.

In an embodiment, the base plate 204 includes any other number of porous plugs than that illustrated in FIG. 2A. For example, the base plate 204 includes 20 or 30 porous plugs.

FIG. 3 is a top view of an embodiment of the porous plug 214. The porous plug 214 has a larger diameter than a diameter of the channel 218. Moreover, the porous plug 214 surrounds the channel 218. As an example, both the porous plug 214 and the channel 218 have an annular cross-sectional shape.

Figure 4A:
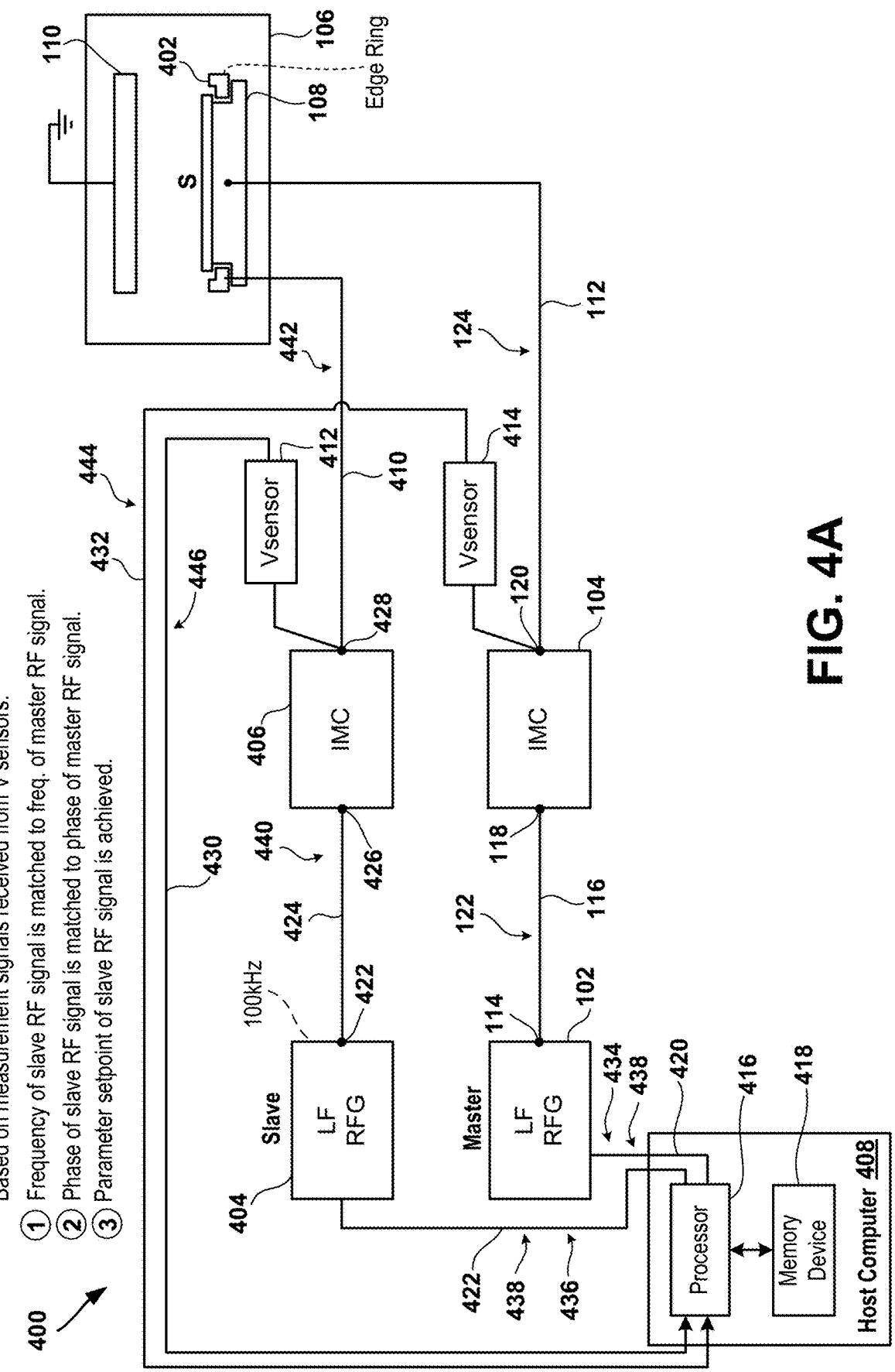
FIG. 4A is a diagram of an embodiment of a system to illustrate an operation of the low frequency RF generator and another low frequency RF generator.
Figure 4B:
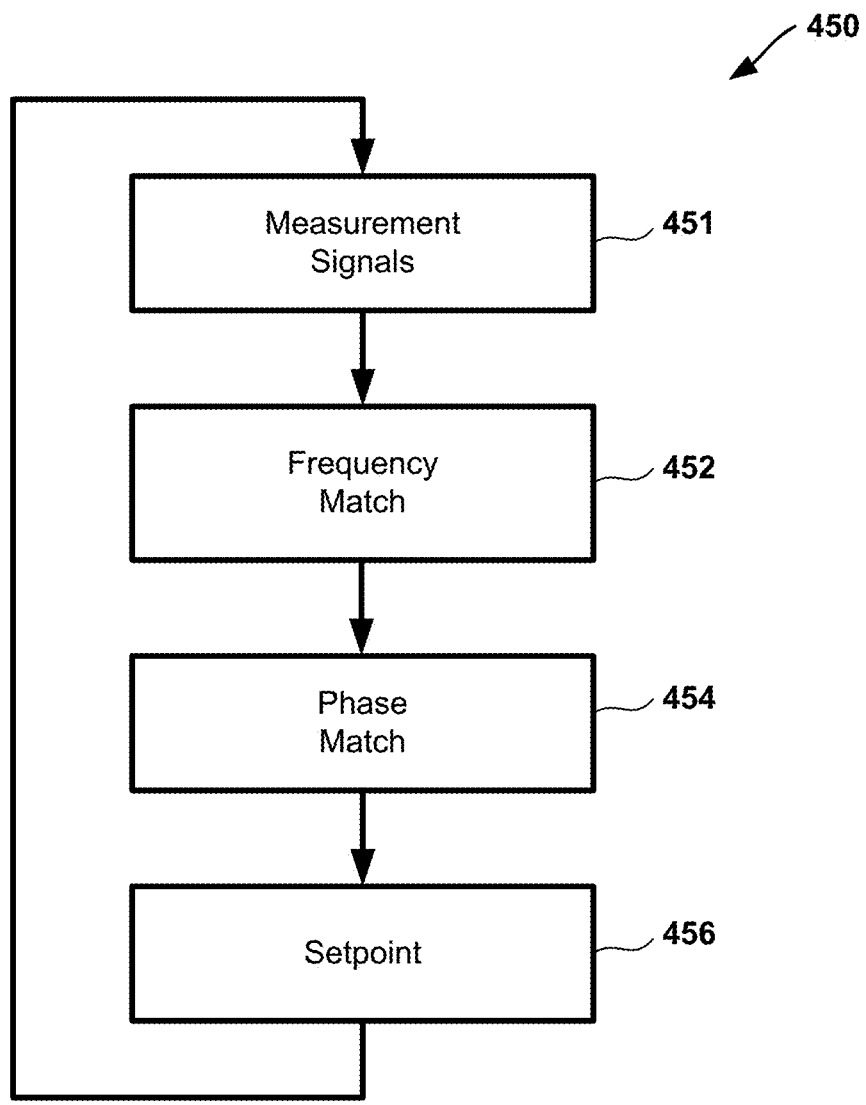
FIG. 4B is a flowchart to illustrate an embodiment of a method executed by the system of FIG. 4A.

FIG. 4A is a diagram of an embodiment of a system 400 to illustrate an operation of the low frequency RF generator 102 and another low frequency RF generator 404. FIG. 4B is a flowchart to illustrate an embodiment of a method 450 executed using the system 400 of FIG. 4A. The system 400 includes a host computer 408, the RF generator 102, the RF generator 404, the impedance matching circuit 104, another impedance matching circuit 406, a voltage sensor 412, another voltage sensor 414, and the plasma chamber 106.

Examples of the host computer 408 include a tablet, a desktop computer, a laptop computer, and a smart phone. The RF generator 404 has similar operating frequencies as that of the RF generator 102. For example, the RF generator 404 has an operating frequency ranging from 10 kHz to 330 kHz. To illustrate, the RF generator 404 has a frequency of operation of 100 kHz. As another illustration, the RF generator 404 has a frequency of operation of 110 kHz. As yet another illustration, the RF generator 102 has an operating frequency of 100 kHz and the RF generator 404 has an operating frequency of 110 kHz. As still another illustration, the RF generator 404 has an operating frequency ranging from and including 90 kHz to 110 kHz.

The plasma chamber 106 includes an edge ring 402 that surrounds a top portion of the substrate support 108. For example, the edge ring 402 is located above the middle surface 228 of the base plate 204 (FIG. 2A) and surrounds a periphery of the dielectric layer 206 (FIG. 2A). The edge ring 402 is sometimes referred to herein as an edge electrode. An edge region of the substrate S is located above the edge ring 402 for being processed by RF power of a modified RF signal 442 that is supplied to the edge ring 402. The edge ring 402 is made from a conductive material, such as silicon, or boron doped single crystalline silicon, or alumina, or silicon carbide, or silicon carbide layer on top of alumina layer, or an alloy of silicon, or a combination thereof. The edge ring 402 is annular in shape.

The host computer 408 includes a processor 416 and a memory device 418. The processor 416 is coupled to the memory device 418. As an example, a processor is a controller, or an application specific integrated circuit (ASIC), or a programmable logic device (PLD), or a central processing unit (CPU), or a microcontroller, or a microprocessor, and these terms are used interchangeably herein. Examples of a memory device, as used herein, include a random access memory (RAM), a read-only memory (ROM), and a combination thereof.

The processor 416 is coupled via a transfer cable 420 to the RF generator 102 and is coupled via another transfer cable 422 to the RF generator 404. An example of a transfer cable, as used herein, includes a cable that transfers data in a serial manner, or a cable that transfers data in a parallel manner, or a cable that transfers data using a Universal Serial Bus (USB) protocol.

The RF generator 404 has an output 422 that is coupled via an RF cable 424 to an input 426 of the impedance matching circuit 406. An output 428 of the impedance matching circuit 406 is coupled via an RF transmission line 410 to the edge ring 402.

The voltage sensor 412 is coupled to the output 428 and the voltage sensor 414 is coupled to the output 120. Also, the voltage sensor 412 is coupled via a transfer cable 430 to the processor 416 and the voltage sensor 414 is coupled via another transfer cable 432 to the processor 416.

The processor 416 sends a control signal 434 via the transfer cable to the RF generator 102 and sends another control signal 436 via the transfer cable 422 to the RF generator 404. The control signal 434 has recipe information, such as one or more parameter levels and one or more frequency levels, of the RF signal 122. An example of a parameter, as used herein, is power or voltage. Similarly, the control signal 436 has recipe information of an RF signal 440 to be generated by the RF generator 404.

Each parameter level of an RF signal and each frequency level of the RF signal defines a state of the RF signal. For example, when the parameter of the RF signal transitions from a first parameter level to a second parameter level during a clock cycle of a synchronization signal 438, the parameter of the RF signal changes its state from a first state to a second state. An example of the synchronization signal 438 is a clock signal having multiple clock cycles that repeat periodically. Another example of the synchronization signal 438 is a digital pulsed signal having a series of digital pulses that repeat periodically. When the parameter of the RF signal transitions from the second parameter level back to the first parameter level during the clock cycle, the parameter of the RF signal changes its state from the second state to the first state. As another example, when the frequency of the RF signal transitions from a first frequency level to a second frequency level during the clock cycle of the synchronization signal 438, the frequency of the RF signal changes its state from a first state to a second state. When the frequency of the RF signal transitions from the second frequency level back to the first frequency level during the clock cycle, the frequency of the RF signal changes its state from the second state to the first state.

As an example, each level of the parameter of an RF signal includes one or more values of the parameter of the RF signal. To illustrate, a first level of the parameter includes one or more values, such as one or more peak-to-peak magnitudes or one or more zero-to-peak magnitudes, of the RF signal and the first level is exclusive of a second level of the parameter of the RF signal. The second level includes one or more values, such as one or more peak-to-peak magnitudes or one or more zero-to-peak magnitudes, of the parameter of the RF signal. To further illustrate, when the first level of the parameter is greater than the second level of the parameter, a minimum of values of the first level is greater than a maximum of values of the second level. As another example, each level of the frequency of an RF signal includes one or more values of the frequency of the RF signal. To illustrate, a first level of the frequency of the RF signal is exclusive of a second level of the frequency of the RF signal. To further illustrate, when the first level of the frequency is greater than the second level of the frequency, a minimum of values of the first level is greater than a maximum of values of the second level. As yet another example, a variable level, such as a frequency level or a parameter level, is an envelope that represents a statistic value of one or more values of the variable level. For example, the variable level includes a mean or a median of multiple values of the variable level.

Upon receiving the control signal 434, the RF generator 102 stores the recipe information of the control signal 434 within one or more memory devices of the RF generator 102. Similarly, when the control signal 436 is received, the RF generator 404 stores recipe information of the control signal 436 within one or more memory devices of the RF generator 404.

The processor 416 generates the synchronization signal 438 and sends the synchronization signal 438 via the transfer cable 420 to the RF generator 102. Also, the processor 416 sends the synchronization signal 438 via the transfer cable 422 to the RF generator 404. In response to the reception of the synchronization signal 438, the RF generator 102 generates the RF signal 122 according to the recipe information within the control signal 434. For example, the parameter of the RF signal 122 has a first power level for a first state, a second power level for a second state, a first frequency level for the first state, and a second frequency level for the second state.

Similarly, in response to the reception of the synchronization signal 438, the RF generator 404 generates the RF signal 440 according to the recipe information within the control signal 436. For example, the parameter of the RF signal 440 has a first power level for a first state, a second power level for a second state, a first frequency level for the first state, and a second frequency level for the second state.

The RF signal 440 is transferred via the RF cable 424 to the input 426. The impedance matching circuit 428 matches an impedance of a load coupled to the output 428 with an impedance of a source coupled to the input 426 to modify an impedance of the RF signal 440 to output the modified RF signal 442. An example of the load coupled to the output 428 includes the RF transmission line 410 and the plasma chamber 106. An example of the source coupled to the input 426 includes the RF cable 424 and the RF generator 404. The modified RF signal 442 is transferred from the output 428 via the RF transmission line 410 to the edge electrode 402. It should be noted that a frequency of each of the RF signal 440 and the modified RF signal 442 is the same as the frequency of operation of the RF generator 404.

When the one or more process gases are supplied to the gap within the plasma chamber 106, the modified RF signal 124 is supplied to the lower electrode of the substrate support 108, and the modified RF signal 442 is supplied to the edge electrode 402, the plasma is stricken or maintained within the plasma chamber 106. A central region of the substrate S is processed by a central portion of the plasma and the edge region of the substrate S is processed by an edge portion of the plasma. The edge portion of the plasma surrounds the central portion of the plasma. The central region of the substrate S is located between the base plate 204 (FIG. 2A) of the substrate support 108 and the upper electrode 110.

When the modified RF signal 124 is supplied, in an operation 451 of the method 450, the voltage sensor 414 measures a voltage, of the modified RF signal 124, at the output 120 to generate a measurement signal 444 during each state, such as the first state or the second state, of a variable of the RF signal 122, and sends the measurement signal 444 via the transfer cable 432 to the processor 416. As an example, the measurement signal 444 is a voltage signal having voltage values of the modified RF signal 124 and the voltage values are measured during the state of the parameter of the RF signal 122. An example of the variable of an RF signal is a frequency of the RF signal or the parameter of the RF signal. Also, when the modified RF signal 442 is supplied, in the operation 451 of the method 450, the voltage sensor 412 measures a voltage of the modified RF signal 442 at the output 428 to generate a measurement signal 446 during each state of the variable of the RF signal 440, and sends the measurement signal 446 via the transfer cable 430 to the processor 416. As an example, the measurement signal 446 is a voltage signal having voltage values that are measured during the state of the parameter of the RF signal 440.

The processor 416 receives the measurement signal 444 during each state, such as the first state or the second state, of the variable of the RF signal 122 and obtains the voltage measured at the output 120 from the measurement signal 444. The processor 416 determines a frequency of the modified RF signal 124 from the voltage measured at the output 120 during each state of the variable of the RF signal 122. For example, the processor 416 applies a Fourier transform to the measurement signal 444 to obtain the frequency of the measurement signal 444 to determine a frequency of the modified RF signal 124 for the first state or the second state of the variable of the RF signal 122. As an illustration, the frequency of the measurement signal 444 is the same as the frequency of the modified RF signal 124 for each state of the variable of the RF signal 122.

In addition, the processor 416 determines a phase of the modified RF signal 124 from the measurement signal 444 for each state, such as the first state or the second state, of the variable of the RF signal 122. For example, the processor 416 determines the phase of the modified RF signal 124 to be the same as a phase of the measurement signal 444 for the first state or the second state of the variable of the RF signal 122.

Also, the processor 416 determines a set point of the parameter of the modified RF signal 124 from the measurement signal 444 for each state, such as the first state or the second state, of the variable of the RF signal 122. For example, the processor 416 identifies, from the measurement signal 444, a parameter level of the parameter of the modified RF signal 124 during the first state or the second state of the parameter of the RF signal 122. The parameter level of the modified RF signal 124 is an example of the set point of the parameter of the modified RF signal 124 for each state of the parameter of the RF signal 122.

Similarly, the processor 416 receives the measurement signal 446 during each state, such as the first state or the second state, of the variable of the RF signal 440 and obtains the voltage measured at the output 428 from the measurement signal 446. The processor 416 determines a frequency of the modified RF signal 442 from the voltage measured at the output 428 during each state of the variable of the RF signal 440. For example, the processor 416 applies a Fourier transform to the measurement signal 446 to obtain the frequency of the measurement signal 446 to determine a frequency of the modified RF signal 442 for the first state or the second state of the variable of the RF signal 440. The frequency of the modified RF signal 442 is the same as the frequency of the measurement signal 446 for each state of the variable of the RF signal 440.

Also, the processor 416 determines a phase of the modified RF signal 442 from the measurement signal 446 for each state of the variable of the RF signal 440. For example, the processor 416 determines the phase of the modified RF signal 442 to be the same as a phase of the measurement signal 446 for the first state or the second state of the variable of the RF signal 440.

Furthermore, the processor 416 determines a set point of the parameter of the modified RF signal 442 from the measurement signal 446 for each state, such as the first state or the second state, of the variable of the RF signal 440. For example, the processor 416 identifies, from the measurement signal 446, a parameter level of the parameter of the modified RF signal 442 during the first state or the second state of the variable of the RF signal 440. The parameter level of the modified RF signal 442 is an example of the set point of the parameter of the modified RF signal 442 during the first state or the second state of the variable of the RF signal 440.

In an operation 452 of the method 450 illustrated in FIG. 4B, the processor 416 determines whether the determined frequency of the modified RF signal 442 for each state, such as the first state or the second state, of the variable of the RF signal 440 is within a predetermined range from the determined frequency of the modified RF signal 124 for the state of the variable of the RF signal 122. For example, the processor 416 determines whether the frequency of the modified RF signal 442 is within ±2 percent or ±5 percent from the frequency of the modified RF signal 124. As another example, the processor 416 determines whether the frequency of the modified RF signal 442 matches the frequency of the modified RF signal 124. The predetermined range associated with the frequencies of the modified RF signals 442 and 124 is stored in the memory device 418.

Upon determining that the frequency of the modified RF signal 442 for the state, such as the first state or the second state, of the variable of the RF signal 440 is not within the predetermined range from the frequency of the modified RF signal 124 for the state of the variable of the RF signal 122, the processor 416 modifies the frequency of the RF signal 440 for the state of the variable of the RF signal 440 or the frequency of the RF signal 122 for the state of the variable of the RF signal 122 or the frequencies of the RF signals 440 and 122. The processor 416 continues to modify the frequency of the RF signal 440 for the state of the variable of the RF signal 440 or the frequency of the RF signal 122 for the state of the variable of the RF signal 122 or the frequencies of the RF signals 440 and 122 until it is determined that the frequency of the modified RF signal 442 for the state of the variable of the RF signal 440 is within the predetermined range from the frequency of the modified RF signal 124 for the state of the variable of the RF signal 122. For example, the processor 416 modifies one or more values within a frequency level of the recipe information within the control signal 436 sent to the RF generator 404 or one or more values within a frequency level of the recipe information within the control signal 434 sent to the RF generator 102 or a combination thereof.

On the other hand, upon determining that the frequency of the modified RF signal 442 for the state, such as the first state or the second state, of the variable of the RF signal 440 is within the predetermined range from the frequency of the modified RF signal 124 for the state of the variable of the RF signal 122, in an operation 454 of the method 450 illustrated in FIG. 4B, the processor 416 determines whether the phase of the modified RF signal 442 for the state of the variable of the RF signal 440 is within a preset range from the phase of the modified RF signal 124 for the state of the variable of the RF signal 122. For example, the processor 416 determines whether a phase difference between the phase of the modified RF signal 442 for the first state of the variable of the RF signal 440 and the phase of the modified RF signal 124 for the first state of the variable of the RF signal 122 is within ±3 percent or ±5 percent. As another example, the processor 416 determines whether the phase of the modified RF signal 442 for the first state of the variable of the RF signal 440 matches the phase of the modified RF signal 124 for the first state of the variable of the RF signal 122. The preset range associated with the phases of the modified RF signals 124 and 442 is stored in the memory device 418.

In response to determining that the phase of the modified RF signal 442 for the state, such as the first state or the second state, of the variable of the RF signal 440 is not within the preset range from the phase of the modified RF signal 124 for the state of the variable of the RF signal 122, the processor 416 modifies a phase of the RF signal 440 during the state of the variable of the RF signal 440 or modifies a phase of the RF signal 122 during the state of the variable of the RF signal 122, or a combination thereof. For example, the processor 416 generates another synchronization signal, such as a clock signal, during the first states of the variables of the RF signals 122 and 440, and sends the other synchronization signal via the transfer cable 422 to the RF generator 404. The other synchronization signal is sent to the RF generator 404 instead of the synchronization signal 438 and is sent within a predefined time period from a time at which the synchronization signal 438 is sent to the RF generator 104 to reduce or remove the phase difference between the phase of the modified RF signal 442 and the phase of the modified RF signal 124. To illustrate, the predefined time period is the same as the phase difference. An example of the predefined time period is a predetermined number of time units, such as microseconds or milliseconds, from the time at which the synchronization signal 438 is sent to the RF generator 104.

In the example, when the RF generator 102 generates the RF signal 122 that repeats a number of states of the variable of the RF signal 122 in synchronization with the synchronization signal 438 and the RF generator 404 generates the RF signal 440 that repeats a number of states of the variable of the RF signal 440 in synchronization with the other synchronization signal, the modified RF signals 124 and 442 have the same phase. It should be noted that the RF signal 122 repeats the number of states of the variable of the RF signal 122 in synchronization with the synchronization signal 438 when the RF signal 122 initiates the repetition of the number of states of the variable at the same time at which the synchronization signal 438 is received from the processor 416 by the RF generator 102. It should further be noted that the RF signal 440 repeats the number of states of the variable of the RF signal 440 in synchronization with the other synchronization signal when the RF signal 440 initiates the repetition of the number of states of the variable at the same time at which the other synchronization signal is received from the processor 416 by the RF generator 404. As another example, instead of sending the other synchronization signal to the RF generator 404, the processor 416 generates yet another synchronization signal during the first states of the variables of the RF signals 122 and 440, and sends the yet another synchronization signal via the transfer cable 420 to the RF generator 102 to remove or reduce the phase difference. The processor 416 continues to modify a phase of the RF signal 440 during each state, such as the first state or the second state, of the variable of the RF signal 440 until the phase of the modified RF signal 442 matches a phase of the modified RF signal 124 during the state of the variable of the RF signal 122.

On the other hand, in response to determining that the phase of the modified RF signal 442 for each state, such as the first state or the second state, of the variable of the RF signal 440 is within the preset range from the phase of the modified RF signal 124 for the state of the variable of the RF signal 122, in an operation 454 of the method 450 illustrated in FIG. 4B, the processor 416 determines from the set point of the parameter of the measurement signal 446 whether the RF generator 404 is operating at a pre-set set point. For example, the processor 416 determines whether the set point of the parameter obtained within the measurement signal 446 is within a predefined range from the parameter level within the recipe information of the control signal 436 sent to the RF generator 404. As an illustration, the predefined range is ±5 percent or ±3 percent. As another illustration, the predefined range is achieved when the set point of the parameter obtained from the measurement signal 446 matches the parameter level within the recipe information of the control signal 436.

Upon determining that the RF generator 422 is not operating at the pre-set set point, the processor 416 modifies, such as increases or decreases, the parameter level to provide a modified set point, and sends the modified set point within the recipe information of the control signal 436 to the RF generator 404 to achieve the pre-set set point. The processor 416 repeats the operations 451-456 for other states, such as the second state of the variable of the RF signal 122 and the second state of the variable of the RF signal 440. It should be noted that by executing the operations 452-456, the substrate S is processed in a uniform manner in the edge region and the central region of the substrate S.

In one embodiment, the operations 452-456 are performed in the order illustrated in FIG. 4B. For example, the operation 454 is performed after the operation 452 and the operation 456 is performed after the operation 454.

In an embodiment in which the RF signals 122 and 440 generated by the RF generators 102 and 404 are continuous wave (CW) RF signals, the operations 451-456 repeat for each cycle of the synchronization signal 438. For example, during a first cycle of the synchronization signal 438, the operations 451-456 are performed. The operations 451-456 are performed during the first cycle based on the measurement signals 444 and 446 generated during the first cycle of the synchronization signal 438. As another example, during a second cycle of the synchronization signal 438, the operations 451-456 are performed. The operations 451-456 are performed during the second cycle based on the measurement signals 444 and 446 generated during the second cycle of the synchronization signal 438. The second cycle of the synchronization signal 438 is consecutive to the first cycle of the synchronization signal 438.

A CW RF signal does not have multiple states. For example, the CW RF signal has a single state. To illustrate, the CW RF signal has a single variable level having one or more variable values that are within a predetermined range from each other. As another illustration, the first frequency level of the RF signal 440 is the same as the second frequency level of the RF signal 440 and the first power level of the RF signal 440 is the same as the second power level of the RF signal 440. As yet another illustration, the first frequency level of the RF signal 122 is the same as the second frequency level of the RF signal 122 and the first power level of the RF signal 122 is the same as the second power level of the RF signal 122.

In one embodiment in which the RF signals 122 and 440 generated by the RF generators 102 and 404 are CW RF signals, the operation 451 is performed during the first cycle of the synchronization signal 438 and the operations 452-456 are performed during the second cycle of the synchronization signal 438. The operations 452-456 are performed during the second cycle of the synchronization signal 438 based on the measurement signals 444 and 446 generated during the first cycle of the synchronization signal 438. Also, during a third cycle of the synchronization signal, the operations 452-456 performed are based on the measurement signals 444 and 446 generated during the second cycle of the synchronization signal 438.

In an embodiment, a frequency with which the operations 451-456 repeat for the RF generators 102 and 404 is less than a frequency with which the operations 451-456 repeat for high frequency RF generators, described herein. The high frequency RF generators are used instead of the low frequency RF generators 102 and 404.

In one embodiment, the impedance matching circuit 406 is not coupled to a high frequency RF generator (not shown). The high frequency RF generator (not shown) has a similar frequency of operation as that of the RF generator 254 (FIG. 2B). For example, the high frequency RF generator (not shown) has a higher frequency of operation than that of the RF generator 102. To illustrate, the high frequency RF generator (not shown) has a frequency of operation of 400 kHz or 2 MHz or 27 MHz or 60 MHz.

In one embodiment, an RF signal, described herein, has any number of states, such as three or four states, during the clock cycle of the synchronization signal and the number of states repeat during each cycle of the synchronization signal. For example, the number of states occur during a first cycle of the synchronization signal and repeat during a second cycle of the synchronization signal. The second cycle of the synchronization signal is consecutive to the first cycle of the synchronization signal.

In an embodiment, there is a dielectric ring between the chuck 108 and the edge ring 402. For example, the dielectric ring surrounds the chuck 108 and the edge ring 402 surrounds the dielectric ring.

FIG. 5 is a diagram of an embodiment of a system 500 to illustrate a method for adjusting a frequency of an RF signal 506 generated by an RF generator 502 during a cycle of an RF signal 508 generated by a high frequency RF generator 504. The system 500 includes the host computer 408, the RF generators 502 and 504, an impedance matching circuit 510, a sensor 512, and the plasma chamber 106.

An example of the RF generator 502 is an RF generator having a frequency of operation of 2 MHz or 13.56 MHz or 27 MHz or 60 MHz. An example of the RF generator 504 is an RF generator having a frequency of operation of 400 kHz or 2 MHz or 13.56 MHz.

The frequency of operation of the RF generator 502 is greater than the frequency of operation of the RF generator 504. For example, when the RF generator 504 has a frequency of operation of 400 kHz, the RF generator 502 has a frequency of operation of 2 MHz or 27 MHz or 60 MHz.

The processor 416 is coupled to the RF generators 502 and 504. Moreover, each RF generator 502 and 504 is coupled to the impedance matching circuit 510, which is coupled to the lower electrode of the substrate support 108.

An output of the impedance matching circuit 510 is coupled to a sensor 512, which is a voltage sensor. Moreover, an output of the RF generator 502 is coupled to a power sensor 514. The sensor 512 and the power sensor 514 are coupled to the processor 416.

The RF generator 502 receives recipe information from the processor 416 for generating the RF signal 506. The recipe information for generating the RF signal 506 has variable levels for generating the RF signal 506, and is stored within the RF generator 502. Similarly, the RF generator 504 receives recipe information from the processor 416 for generating the RF signal 508. The recipe information for generating the RF signal 508 has variable levels for generating the RF signal 508, and is stored within the RF generator 504.

In addition, each RF generator 502 and 504 receives a synchronization signal, such as a clock signal. In response to the reception of the synchronization signal, the RF generator 502 generates the RF signal 506 having the variable levels for generating the RF signal 506. Similarly, in response to the reception of the synchronization signal, the RF generator 504 generates the RF signal 508 having the variable levels for generating the RF signal 508.

The impedance matching circuit 510 receives the RF signals 506 and 508, modifies impedances of the RF signals 506 and 508 to provide two modified RF signals, and combines the two modified RF signals to output a modified RF signal 515 at an output 518 of the impedance matching circuit 510. The modified RF signal 515 is supplied from the output 518 of the impedance matching circuit 510 to the lower electrode of the substrate support 108.

When the one or more process gases and the modified RF signal 515 are supplied to the lower electrode of the substrate support 108, plasma is stricken or maintained within the plasma chamber 106. Also, when the modified RF signal 515 is supplied to the lower electrode of the substrate support 108, the sensor 512 measures a voltage at the output 518 of the impedance matching circuit 510 to generate a measurement signal 516, such as a voltage signal. The measurement signal 516 is sent from the sensor 512 to the processor 416. Also, the power sensor 514 measures power at an output 520 of the RF generator 502 to generate a measurement signal 522 and sends the measurement signal 522 to the processor 416.

The processor 416 receives the measurement signal 516 and divides each cycle of the measurement signal 516 into a predetermined number m of bins, where m is a positive integer. For example, the processor 416 divides each cycle of the measurement signal 516 into 15 bins or 20 bins. To illustrate, each cycle of the measurement signal 516 is divided into a bin 1, a bin 2, and so on until a bin m, where m is a positive integer.

Moreover, from the measurement signal 522, the processor 416 obtains a value of delivered power for each bin 1 through m. For example, the processor 416 determines that for the bin 1, a value of delivered power is DP1. Similarly, the processor 416 determines a value of delivered power as DP2 for the bin 2 and a value of delivered power as a DPm for the bin m.

The processor 416 adjusts a frequency of operation of the RF generator 502 for each bin to increase the delivered power for the bin. For example, the processor 416 adjusts a frequency of operation of the RF generator 502 from a value HF1 to a value AHF1 for the bin 1. Moreover, the processor 416 adjusts a frequency of operation of the RF generator 502 from a value HF2 to a value AHF2 for the bin 2 and adjusts a frequency of operation of the RF generator 502 from a value HFm to a value AHFm for the bin m.

FIG. 6 is an embodiment of a graph 600 to illustrate a voltage signal 602. The voltage signal 602 successes an example of the measurement signal 516 (FIG. 5). The graph 600 plots voltage values of the voltage signal 602 versus time t. The voltage values are plotted on a y-axis and the time t is plotted on an x-axis. The time t is divided into multiple time intervals or time periods. For example, the time t is divided in equal time intervals, which include a first time interval from a time t0 to a time t1, a second time interval from the time t1 to a time t2, a third time interval from the time t2 to a time t3, and so on until a ninth time interval from a time t8 to a time t9. Also, the equal time intervals include a tenth time interval from the time t9 to a time t10, an eleventh time interval between the time t10 and a time t11, and so on until a twentieth time interval between a time t19 and a time t20. Each time interval or time period of the voltage signal 602 is equal. For example, the first time interval is equal to the second time interval and the second time interval is equal to the eleventh time interval.

The voltage signal 602 has multiple cycles, such as a cycle 1 and a cycle 2, that repeat over the time t. Each cycle is divided into the predetermined number of bins m. For example, the cycle 1 of the voltage signal 602 is divided into 20 bins and the cycle 2 of the voltage signal 602 is divided into 20 bins. To illustrate, a bin 1 of the voltage signal 602 occurs during a time period from the time t0 to the time t1, a bin 2 of the voltage signal 602 occurs during a time period from the time t1 to the time t2, and so on. Also, a bin 10 of the voltage signal 602 occurs during a time period from the time t9 to the time t10 and a bin 11 of the voltage signal 602 occurs during a time period from the time t10 to the time t11. A bin 20 of the voltage signal 602 occurs during a time period from the time t19 to the time t20. Similarly, the cycle 2 of the voltage signal 602 is divided into 20 bins, and each of the 20 bins is of an equal time interval.

FIG. 7 is a diagram of an embodiment of a system 700 to illustrate binning for the low frequency RF generator 102. The system 700 includes the RF generator 102, an RF generator 701, an impedance matching circuit 702, the plasma chamber 106, the sensors 512 and 514, and the host computer 408. The RF generator 701 has a higher frequency of operation that a frequency of operation of the RF generator 102. For example the RF generator 701 has a frequency of operation of 400 kHz, or 2 MHz, or 13.56 MHz, or 27 MHz, or 60 MHz.

The output 114 of the RF generator 102 is coupled via the RF cable 116 to an input 704 of the impedance matching circuit 702. Also, an output 706 of the RF generator 701 is coupled via an RF cable 708 to another input 710 of the impedance matching circuit 702. An output 712 of the impedance matching circuit is coupled via the RF transmission line 112 to the lower electrode of the substrate support 108. The sensor 512 is coupled to the output 712 of the impedance matching circuit 702 and the power sensor 514 is coupled to the output 706 of the RF generator 701. The processor 416 is coupled via the transfer cable 422 to the RF generator 701. Also, the processor 416 is coupled via an RF cable 714 to the sensor 512. The processor 416 is coupled via a transfer cable 716 to the power sensor 514.

The processor 416 sends the control signal 434 via the transfer cable 420 to the RF generator 102. In addition, the processor 416 sends a control signal 718 via the transfer cable 422 to the RF generator 701. The control signal 718 includes recipe information, such as variable levels for multiple states, of a variable of an RF signal 720 to be generated by the RF generator 701. For example, the control signal 718 includes a parameter level and a frequency level for the first state of the parameter of the RF signal 720 and a parameter level and a frequency level for the second state of the parameter of the RF signal 720. Upon receiving the control signal 718, the RF generator 701 stores the recipe information received within the control signal 718 in one or more memory devices of the RF generator 701.

The processor 416 simultaneously sends the synchronization signal 438 to the RF generators 102 and 701. In response to the reception of the synchronization signal 438, the RF signal 122 is generated by the RF generator 102 in the same manner described above with reference to FIG. 4A. Also, in response to the reception of the synchronization signal 438, the RF generator 701 generates the RF signal 720 having the variable levels received within the recipe information of the control signal 718.

The RF signal 122 is transferred via the RF cable 116 to the input 704 and the RF signal 720 is transferred via the RF cable 708 to the input 710 of the impedance matching circuit 702. The input 704 is coupled via a first branch circuit of the impedance matching circuit 702 to the output 712 and the input 710 is coupled via a second branch circuit of the impedance matching circuit 702 to the output 712.

When the RF signal 122 is transferred from the input 704 via the first branch circuit, the impedance matching circuit 702 matches an impedance of a load coupled to the output 712 of the impedance matching circuit 702 with an impedance of a source coupled to the input 704 of the impedance matching circuit 702 to modify an impedance of the RF signal 120 to provide a first modified RF signal. An example of the load coupled to the output 712 includes the RF transmission line 112 and the plasma chamber 106. An example of the source coupled to the input 704 includes the RF cable 116 and the RF generator 102.

Also, when the RF signal 720 is transferred from the input 710 via the second branch circuit, the impedance matching circuit 702 matches an impedance of the load coupled to the output 712 with an impedance of a source coupled to the input 710 of the impedance matching circuit 702 to modify an impedance of the RF signal 720 to provide a second modified RF signal. An example of the source coupled to the input 710 includes the RF cable 702 and the RF generator 701. The first modified RF signal is combined with the second modified RF signal at the output 712 to output a modified RF signal 722 at the output 712. The modified RF signal 722 is transferred via the RF transmission line 112 to the lower electrode of the plasma chamber 106. When the one or more process gases and the modified RF signal 722 are supplied to the plasma chamber 106, plasma is generated or stricken within the plasma chamber 106 to process the substrate S within the plasma chamber 106.

When the modified RF signal 722 is supplied, the sensor 512 measures a voltage at the output 712 to output a measurement signal 724 and provides the measurement signal 724 via the transfer cable 714 to the processor 416. An example of the measurement signal 724 is a voltage signal. Also, the power sensor 514 measures power, such as delivered power, at the output 706 to generate a measurement signal 726 and supplies the measurement signal via the transfer cable 716 to the processor 416. The delivered power at the output 706 is a difference between power supplied by the RF generator 701 at the output 706 and power reflected towards the RF generator 701 at the output 706. The power supplied by the RF generator 701 is an amount of power of the RF signal 720 that is supplied by the RF generator 701. The power reflected towards the RF generator 701A is reflected from the plasma chamber 106 via the RF transmission line 112, the output 712, the second branch circuit of the impedance matching circuit 702, the input 710, and the RF cable 708 to the input 706 of the RF generator 701.

When the measurement signal 724 is received, the processor 416 divides each cycle of the measurement signal 724 into multiple bins, such as bins 1a, 2a, through na, where n is a positive integer. For example, when the RF generator 102 is used within the system 700 instead of or in place of a high frequency RF generator, such as the RF generator 504 and the RF generator 502 (FIG. 5), the processor 416 receives an indication from a user that the RF generator 102 having a low frequency of operation is coupled within the system 700. When the high frequency generator is used in the system 700, the high frequency RF generator is coupled via the RF cable 116 to the input 704. The indication is received via an input device, such as a mouse or a keyboard or a stylus or a keypad, that is coupled to the processor 416. The indication includes a frequency of operation of the RF generator 102. The processor 416 receives the indication and determines that the frequency of the operation of the RF generator 102 is lower than a frequency of operation of the high frequency RF generator that is now decoupled from the input 704.

After determining that the frequency of operation of the RF generator 102 coupled in the system 700 is lower than a frequency of operation of the high frequency RF generator previously coupled to the input 704 of the impedance matching circuit 702 of the system 700 and upon receiving the measurement signal 724, the processor 416 divides each cycle of the measurement signal 724 into a number of bins that is different than the predetermined number of bins for each cycle of the measurement signal 516 of FIG. 5. To illustrate, the processor 416 divides each cycle of the measurement signal 724 into a greater number of bins, such as 50 bins or 60 bins, than the predetermined number of bins that divide each cycle of the measurement signal 516. This is because impedance of plasma within the plasma chamber 106 does not change as quickly when the low frequency RF generator 102 is used instead of the high frequency RF generator 504 (FIG. 5) or 502 (FIG. 5). As another illustration, the processor 416 divides each cycle of the measurement signal 724 into a lower number of bins, such as 5 bins are 10 bins, than the number of bins of each cycle of the measurement signal 516.

It should be noted that a bin represents a time interval during which a measurement signal that is divided into multiple bins is generated. The time interval is a time period that occurs during a cycle of the measurement signal. For example, the bin 1a represents a first time interval during which the measurement signal 724 is generated by the sensor 512 and the bin 2a represents a second time interval during which the measurement signal 724 is generated by the sensor 512. The second time interval for the bin 2a is consecutive to the first time interval for the bin 1a. The first and second time intervals occur during each cycle of the measurement signal.

The processor 416 determines, from the measurement signal 726, delivered power for each bin of the measurement signal 726. For example, the processor 416 determines that during the first time interval of the bin 1a of the measurement signal 726, an amount of delivered power at the output 706 is DP1a. To illustrate, the processor 416 generates a statistical value, such as a mean value or a median value, of values of power of the measurement signal 726 generated during the first time interval of the bin 1a within a cycle of the measurement signal 726. The statistical value is the amount DP1a. Similarly, the processor 416 determines that during the second time interval of the bin 2a of the measurement signal 726, an amount of delivered power at the output 706 is DP2a and during an nth time interval of the bin na of the measurement signal 726, an amount of delivered power at the output is DPna. In this illustration, each cycle of the measurement signal 726 is divided into n bins or n time intervals.

The processor 416 determines, for the bin 1a, that by adjusting a frequency of the RF signal 720 from a value HF1a to a value AHF1a, delivered power for the bin 1a increases from the value DP1a to an increased value, such as IDP1a. For example, during a time interval for the bin 1a, the processor 416 changes a value, such as a statistical value, of a frequency level within the recipe information of the control signal 718 sent to the RF generator 701 from HF1a to AHF1a. After the control signal 718 having the adjusted frequency value AHF1a for the bin 1a is received by the RF generator 701, during a next cycle of the synchronization signal 438, the RF generator 701 generates the RF signal 720 having the adjusted frequency value AHF1a for the bin 1a. Also, during a time period for the bin 1a in which the RF signal 720 has the adjusted frequency value AHF1a, the power sensor 514 measures the increased value of delivered power, such as IDP1a, and sends the increased value via the transfer cable 716 to the processor 416. The processor 416 determines that for the bin 1a, by adjusting the frequency value from HF1a to AHF1a, the delivered power measured by the power sensor 514 increases from the value DP1a to IDP1a. Upon determining so, the processor 416 maintains the frequency value of the RF signal 720 for the bin 1a to be AHF1a instead of HF1a. It should be noted that a frequency of an RF signal is adjusted by increasing or decreasing the frequency of the RF signal. On the other hand, upon determining that for the bin 1a, by adjusting the frequency from HF1a to AHF1a, the delivered power measured by the power sensor 514 decreases from the value DP1a to DDP1a, the processor 416 maintains the frequency value of the RF signal 720 at HF1a for the bin 1a.

In a similar manner, the processor 416 determines for each of the remaining bins 2a through na of the measurement signal 724, whether adjusting respective frequency values HF2a through HFna to respective frequency values AHF2a through AHFna increases or decreases respective delivered power values DP2a through DPna. For example, the processor 416 determines for the bin na, whether adjusting the frequency value HFna of the RF signal 720 to AHFna increases the delivered power value from DPna to an increased delivered power value IDPna or decreases the delivered power value from DPna to a decrease delivered power value DDPna. Upon determining that adjusting the frequency value of the RF signal 720 for the bin na from HFna to AHFna increases the delivered power DPna, the processor 416 controls the RF generator 701 to generate the RF signal 720 having the adjusted frequency value AHFna, such as a statistical value of a frequency level, for the bin na. On the other hand, upon determining that adjusting the frequency value of the RF signal 720 for the bin na from HFna to AHFna decreases the delivered power DPna, the processor 416 controls the RF generator 701 to continue to generate the RF signal 720 having the frequency value HFna.

In one embodiment, a time interval of a bin of the measurement signal 724 coincides with each state of the variable of the RF signal 720. For example, during a time interval of the bin 1a, the variable of the RF signal 720 has the first state, during a time interval for the bin 2a, the variable of the RF signal 720 has the second state, and so on. To illustrate, during a time interval for the bin na, the variable of the RF signal 720 has an nth state. The variable of the RF signal 720 transitions from one state to another at an end of a time interval of the bin. For example, the variable of the RF signal 720 transitions from the first state to the second state at an end of the time interval for the bin 1a, transitions from the second state to a third state at an end of the time interval for the bin 2a, and transitions from an (n−1)th state to the nth state at an end of the time interval for a bin (n−1)a of the measurement signal 724.

Figure 8:
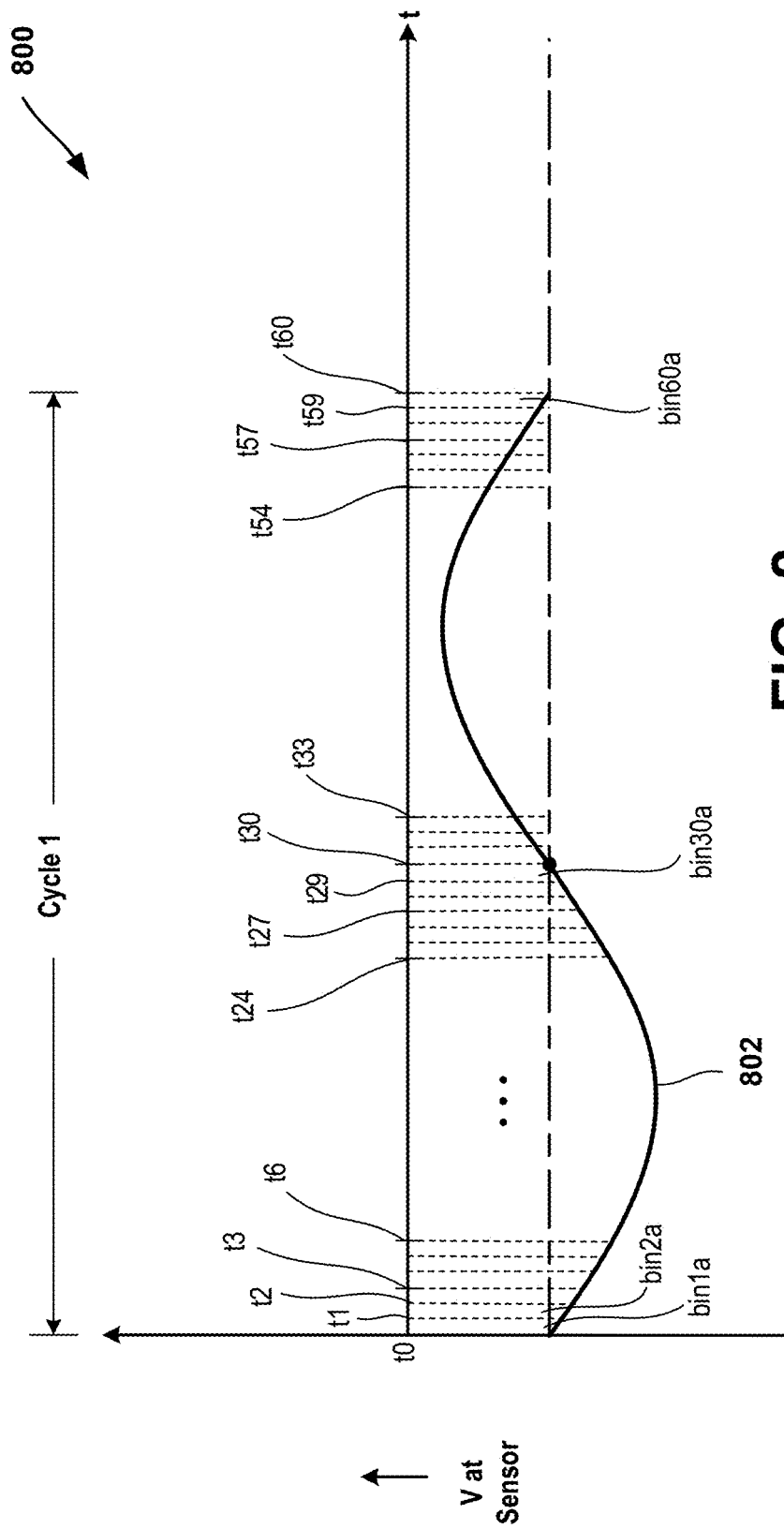
FIG. 8 is an embodiment of a graph to illustrate a voltage signal that is generated by a sensor of the system of FIG. 7.

FIG. 8 is an embodiment of a graph 800 to illustrate a voltage signal 802 that is generated by the sensor 512 of FIG. 7. The graph 800 plots voltage measured by the sensor 512 at the output 712 of the impedance matching circuit 702 (FIG. 7) versus the time t. The voltage measured by the sensor 512 is plotted on a y-axis and the time t is plotted on an x-axis. The voltage signal 802 is output by the sensor 512. The voltage signal 802 has multiple cycles, such as a cycle 1, a cycle 2, and so on. Each cycle of the voltage signal 802 repeats over the time t.

The processor 416 (FIG. 7) receives the voltage signal 802 from the sensor 512 via the transfer cable 714 (FIG. 7) and divides each cycle of the voltage signal 802 into a pre-determined number of bins. For example, the processor 416 divides the cycle 1 of the voltage signal 802 into 60 bins from the bin 1a to the bin 60a. The bin 1a extends from a time t0 to a time t1. Similarly, the bin 2a extends from the time t1 to a time t2. The bin 30a extends from a time t29 to a time t30 and the bin 60a extends from a time t59 to a time t60.

Each time segment on the x-axis of the graph 800 is equal. For example, the time segment between the times t0 and t1 is equal to the time segment between the times t1 and t2. As such, the bin 1a extends for a time interval that is equal to a time interval for which bin 2a extends.

It should be noted that the pre-determined number of bins that are generated by the processor 416 are different for the low frequency RF generator 102 (FIG. 7) compared to a preset number of bins that are generated by the processor 416 for a high frequency RF generator, such as the RF generator 504 (FIG. 5) or the RF generator 502 (FIG. 5). For example, when the RF generator 504 or the RF generator 502 are coupled to the input 704 of the impedance matching circuit 702 (FIG. 7) via the RF cable 116 instead of the RF generator 102, the processor 416 divides each cycle of a voltage signal received from the sensor 512 into the preset number of bins. When the RF generator 102 is coupled to the input 704, the predetermined number of bins is used.

In one embodiment, the processor 416 divides each cycle of the voltage signal 802 into a different number of bins than that illustrated in FIG. 8. For example, the processor 416 divides the voltage signal 802 into a number of bins greater than 60 or a number of bins less than 60.

Figure 9:
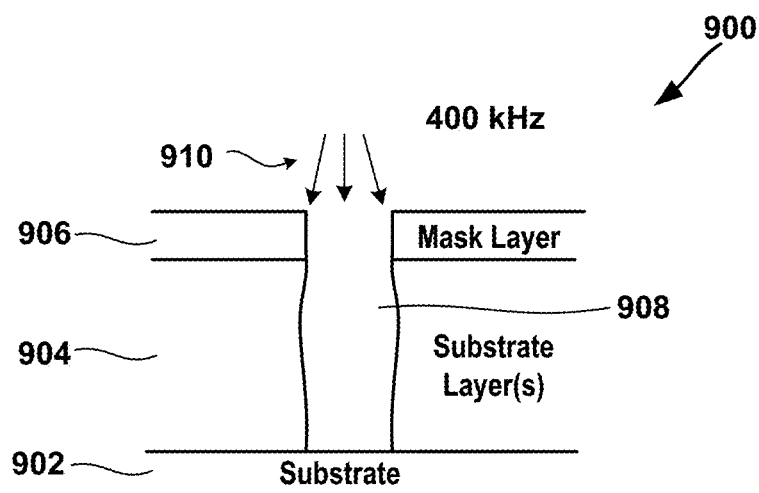
FIG. 9 is a diagram of an embodiment of a substrate to illustrate that a vertical directionality of ions of plasma generated by using a high frequency RF generator is less compared to a vertical directionality of ions of plasma generated by using the low frequency RF generator.

FIG. 9 is a diagram of an embodiment of a substrate 900 to illustrate that that a vertical directionality of ions of plasma generated by using the high frequency RF generator is less compared to a vertical directionality of ions of plasma generated by using the low frequency RF generator. The substrate 900 includes a substrate layer 902, one or more substrate stack layers 904, and a mask layer 906. An example of the substrate layer 902 is a silicon layer. An example of the one or more substrate stack layers 904 include a layer of aluminum nitride (AlN) overlaid on top of the substrate layer 902, a buffer layer overlaid on top of the AlN layer, and a gallium nitride (GaN) overlaid on top of the buffer layer. The buffer layer can be a dielectric layer. Another example of the one or more substrate stack layers 904 include a pad overlaid on top of the substrate layer 902, a barrier and seed layer overlaid on top of the pad, a photoresist layer overlaid on top of the barrier and seed layer. The photoresist layer is patterned by applying the mask layer 906 to form features to overlay a copper layer in the features. One of the features is illustrated as a feature 908.

When the RF generator 504 or the RF generator 502 is coupled to the input 704 of the impedance matching circuit 702 (FIG. 7) via the RF cable 116 instead of the RF generator 102, a vertical directionality 910 of plasma ions formed within the plasma chamber 106 is less. As such, an etch rate of etching the features decreases. Also, the plasma ions having the vertical directionality 910 etch into side walls of the one or more substrate layers 904.

Figure 10:
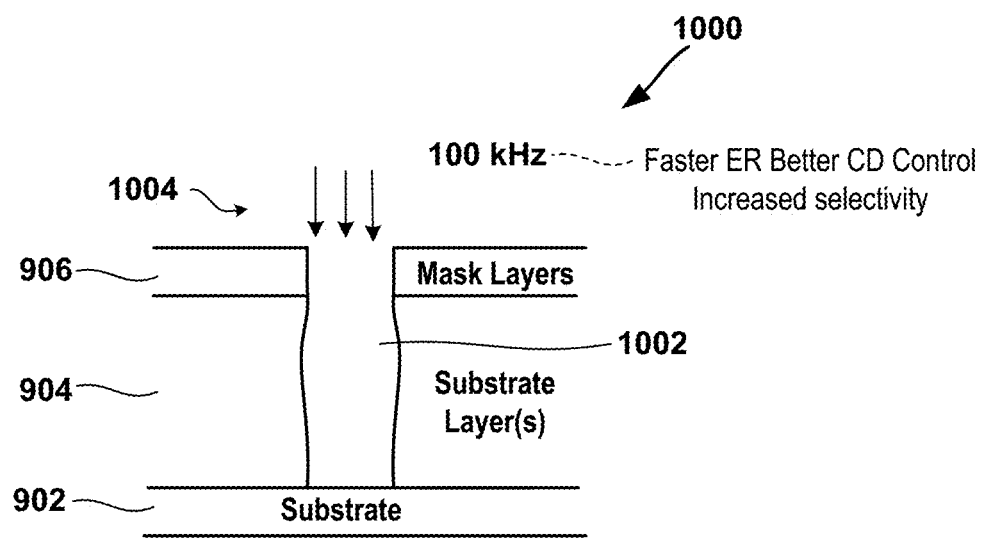
FIG. 10 is a diagram of an embodiment of a substrate to illustrate that the vertical directionality of ions of plasma generated by using the low frequency RF generator is greater compared to the vertical directionality of ions of plasma generated by using the high frequency RF generator.

FIG. 10 is a diagram of an embodiment of a substrate 1000 to illustrate that the vertical directionality 910 of ions of plasma generated by using the low frequency RF generator is greater compared to a vertical directionality 1004 of ions of plasma generated by using the high frequency RF generator. The substrate 1000 has the same type of layers 902, 904, and 906 as that of the substrate 900 (FIG. 9) except that in the substrate 1000, the one or more layers 904 are not etched or etched less by plasma ions. For example, features, such as a feature 1002, are formed in the one or more substrate stack layers 904. The features are etched at a rate that is greater than a rate at which the features are etched within the substrate 900. This is due to the vertical directionality 1004 of plasma ions.

When the low frequency RF generator 102 is coupled to the input 704 of the impedance matching circuit 702 (FIG. 7) via the RF cable 116 instead of the high frequency RF generator 504 or 502, the vertical directionality 910 of plasma ions formed within the plasma chamber 106 increases to the vertical directionality 1004. As such, an etch rate of etching the features increases. Also, the plasma ions having the vertical directionality 1004 do not etch into the sidewalls of the one or more substrate layers 904.

Due to the increased vertical directionality 1004, there is less etching or no etching of the side walls of the one or more substrate layers 904 of the substrate 1000 compared to an amount of etching of the side walls of the one or more substrate layers 904 of the substrate 900. Also, there is an increase in the etch rate of etching the features of the substrate 1000 compared to etching the features of the substrate 900.

Also, there is an increase in amount of control of a critical dimension (CD) of the one or more substrate layers 904 of the substrate 1000 compared to an amount of CD control of the one or more substrate layers 904 of the substrate 900. For example, a width of the feature 1002 is less than a width of the feature 908 to form a narrower and more uniform feature within the one or more substrate layer 904 of the substrate 1000. The feature 1002 is narrower than the feature 908.

Because of the greater vertical directionality 1004 being focused in a vertical direction compared to the vertical directionality 910, selectivity of the one or more substrate layers 904 of the substrate 1000 increases compared to selectivity of the one or more substrate layers 904 of the substrate 900. For example, there is an increase in a ratio of etch rate of the one or more substrate layers 904 of the substrate 1000 and the mask layer 906 of the substrate 1000 compared to a ratio of etch rate of one or more substrate layers 904 of the substrate 900 and the mask layer 906 of the substrate 900.

It should be noted that although FIGS. 9 and 10 are described with respect to etch rates, in some embodiments, a rate of processing, such as a deposition rate, a sputtering rate, or a cleaning rate, of the substrate S is increased when the low frequency RF generator 102 replaces the high frequency RF generator.

Figure 11:
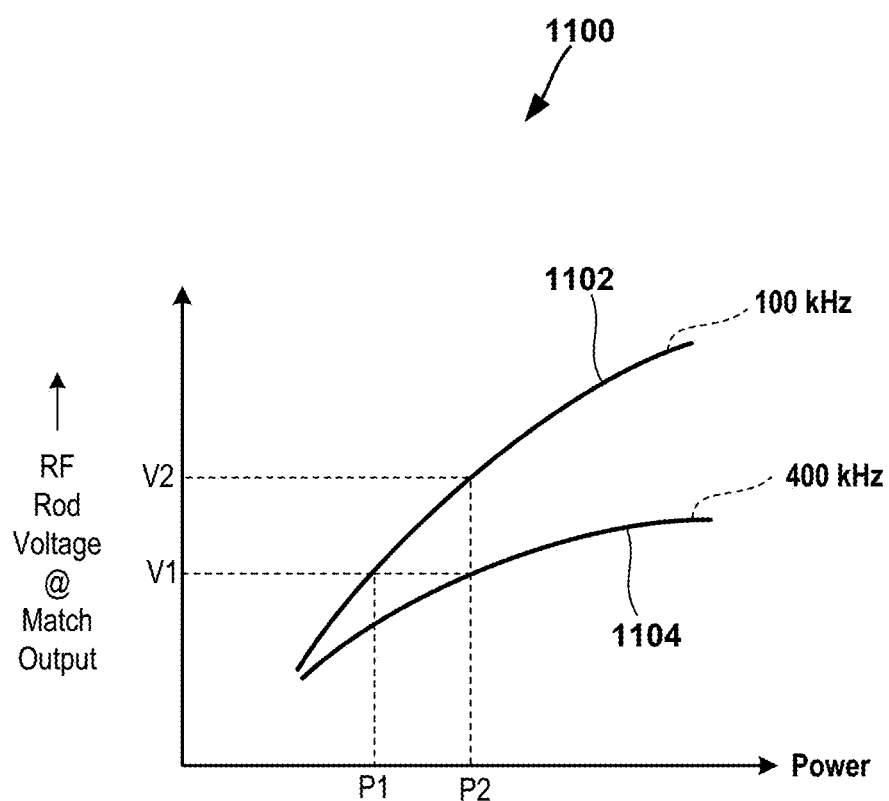
FIG. 11 is an embodiment of a graph to illustrate that a higher voltage is generated by the low frequency RF generator than that generated by a high frequency RF generator when the same amount of power is applied to both the low and high frequency RF generators.

FIG. 11 is an embodiment of a graph 1100 to illustrate that a higher voltage is generated by the low frequency RF generator than that generated by the high frequency RF generator when the same amount of power is applied to both the low and high frequency RF generators. The graph 1100 plots a voltage signal 1102 and another voltage signal 1104 versus power. The voltage signal 1102 has voltages measured at the output 120 (FIG. 1A) of the impedance matching circuit 104 (FIG. 1A). The voltage signal 1104 has voltages measured at an output of the match 252 (FIG. 2B). The voltage signal 1102 is generated when the RF generator 102 is coupled to the input 118 of the impedance matching circuit 104 (FIG. 1A) via the RF cable 116 (FIG. 1A) and the voltage signal 1104 is generated when the high frequency RF generator, such as the RF generator 504 (FIG. 5) or the RF generator 502 (FIG. 5) or the RF generator 254 (FIG. 2B) or the RF generator 701 (FIG. 7) is coupled to the match 252. It should be noted that 400 kHz illustrated in FIG. 11 is an example of the high frequency RF generator.

It should further be noted that when the same amount of power P2 is supplied to both the low frequency RF generator 102 and the high frequency RF generator, a voltage V2 is generated at the output of the match 252 and the voltage V2 is greater than a voltage V1 generated at the output 120. As an example, the voltage V2 is between two and three times the voltage V1. As another example, the voltage V2 is twice the voltage V1. As yet another example, the voltage V2 is thrice the voltage V1. The voltage V1 is a point on the voltage signal 1104 and the voltage V2 is a point on the voltage signal 1102. Also, it should be noted that for generating the same amount of voltage V1 at the output 120, an amount of power P1 that is supplied to the low frequency RF generator 102 is less than the amount of power P2 supplied to the high frequency RF generator.

As such, to achieve the same process result, such as an etch rate or a deposition rate or a sputtering rate, a lower amount of power is supplied to the RF generator 102 compared to an amount of power supplied to the high frequency RF generator. By supplying the lower amount of power, an equal amount of voltage is generated by the RF generator 102 compared to the high frequency RF generator to achieve the same process result.

Figures 12A, 12B, 12C:
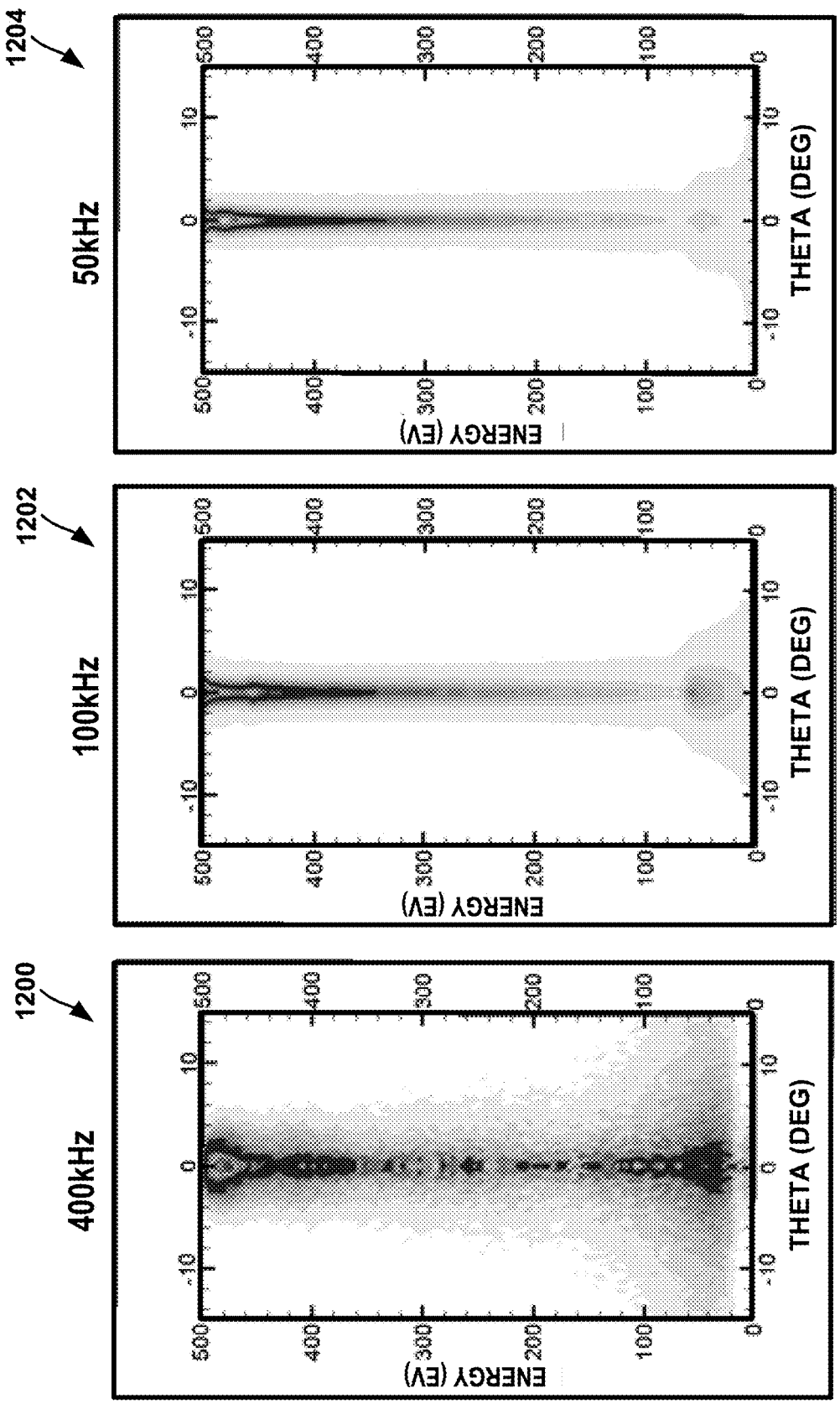
FIG. 12A is an embodiment of a graph to illustrate an ion energy distribution across a surface of a substrate.
FIG. 12B is an embodiment of a graph to illustrate another ion energy distribution across the surface of the substrate.
FIG. 12C is an embodiment of a graph to illustrate yet another ion energy distribution across the surface of the substrate.

FIG. 12A is an embodiment of a graph 1200 to illustrate an ion energy and angular distribution across the top surface of the substrate S (FIG. 1A). The graph 1200 plots ion energy, in electron volts (eV) on a y-axis and an angle theta (θ) that spans horizontally across a top surface of the substrate S on an x-axis. The ion energy is of plasma that is generated within the plasma chamber 106 (FIG. 1A) when the 400 kHz RF generator is coupled to the substrate support 108 (FIG. 1A) via the match 252 (FIG. 2B).

FIG. 12B is an embodiment of a graph 1202 to illustrate another ion energy and angular distribution across the top surface of the substrate S (FIG. 1A). The graph 1202 plots ion energy on a y-axis and the angle theta that spans horizontally across the top surface of the substrate S on an x-axis. The ion energy, illustrated in the graph 1202, is of plasma that is generated within the plasma chamber 106 (FIG. 1A) when the RF generator 102 is coupled to the substrate support 108 (FIG. 1A) via the IMC 104.

Ion angular distribution across the top surface of the substrate S is narrower in the graph 1202 compared to that illustrated in the graph 1200. For example, the ion angular distribution as illustrated in the graph 1202 ranges from −10 degrees to 10 degrees at the top surface of the substrate S. Comparatively, the ion angular distribution illustrated in the graph 1200 ranges from an angle greater than −10 degrees to an angle greater than 10 degrees at the top surface of the substrate S. The low frequency RF generator 102 narrows the ion angular distribution, which increases a rate, such as an etch rate or a deposition rate, of processing the substrate S. It should be noted that the RF generator 102 is operated at a frequency of 100 kHz to generate the graph 1202.

FIG. 12C is an embodiment of a graph 1204 to illustrate yet another ion energy and angular distribution at the top surface of the substrate S (FIG. 1A). The graph 1204 plots ion energy on a y-axis and the angle theta that spans horizontally at the top surface of the substrate S on an x-axis. The ion energy, illustrated in the graph 1204, is of plasma that is generated within the plasma chamber 106 (FIG. 1A) when the RF generator 102 is coupled to the substrate support 108 (FIG. 1A) via the IMC 104. As shown, ion angular distribution across the top surface of the substrate S is narrower in the graph 1204 compared to that illustrated in the graph 1200. For example, a majority of ion energy in the graph 1204 is focused within a range from −4 degrees to 4 degrees at the top surface of the substrate S. It should be noted that the RF generator 102 is operated at a frequency of 50 kHz to generate the graph 1204.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment, described above, are combined with one or more features of any other embodiment, also described above, without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

The invention claimed is:

1. A system comprising:
   a first radio frequency (RF) generator having a first operating frequency range between 10 kilohertz (kHz) and 330 kHz, wherein the first RF generator is configured to generate a first RF signal;
   a first impedance matching circuit coupled to the first RF generator to receive the first RF signal and modify an impedance of the first RF signal to output a first modified RF signal; and
   a plasma chamber configured to receive the first modified RF signal, wherein the plasma chamber includes a chuck having a dielectric layer and a base metal layer, wherein the dielectric layer is located on top of the base metal layer, wherein the dielectric layer has a bottom surface, wherein the base metal layer has a porous plug, wherein the bottom surface of the dielectric layer has a portion that is in contact with the porous plug, wherein the dielectric layer has a thickness less than a thickness of a conventional dielectric layer that is used with a conventional RF generator having an operating frequency greater than the first operating frequency range.

2. The system of claim 1, wherein the plasma chamber includes an edge ring that surrounds the chuck, the system further comprising:
   a second RF generator having a second operating frequency range between 10 kHz and 330 kHz, wherein the second RF generator is configured to generate a second RF signal;
   a second impedance matching circuit coupled to the second RF generator for receiving the second RF signal and modifying an impedance of the second RF signal to output a second modified RF signal,
   wherein the edge ring is coupled to the second impedance circuit to receive the second modified RF signal.

3. The system of claim 2, further comprising:
   a host computer coupled to the first and second RF generators, wherein the host computer is configured to:
      control the second RF generator until a frequency of the second modified RF signal is within a pre-determined range from a frequency of the first modified RF signal;
      control the second RF generator until a phase of the second modified RF signal to be within a pre-set range from a phase of the first modified RF signal; and
      control the second RF generator to achieve a voltage setpoint.

4. The system of claim 3, wherein the pre-determined range is achieved when the frequencies of operation of the first and second modified RF signals are the same, wherein the thickness of the dielectric layer ranges from 0.7 millimeters to 0.9 millimeters.

5. The system of claim 3, wherein the pre-set range is achieved when the phases of the first and second modified RF signals are the same.

6. The system of claim 1, wherein the dielectric layer excludes any porous plugs, wherein the first operating frequency range is from 90 kHz to 110 kHz.

7. A system comprising:
   a first radio frequency (RF) generator having an operating frequency range between 10 kilohertz (kHz) and 330 kHz, wherein the first RF generator is configured to generate a first RF signal;
   a first impedance matching circuit coupled to the first RF generator for receiving the first RF signal and modifying an impedance of the first RF signal to output a first modified RF signal;
   a plasma chamber configured to receive the first modified RF signal, wherein the plasma chamber includes a chuck having a dielectric layer and a base metal layer, wherein the dielectric layer is located on top of the base metal layer, wherein the dielectric layer has a bottom surface, wherein the base metal layer has a porous plug, wherein the bottom surface of the dielectric layer has a portion that is in contact with the porous plug;
   a second RF generator configured to generate a second RF signal;
   a host computer coupled to the first and second RF generators, wherein the host computer is configured to:
      receive an indication that the first RF generator has replaced a third RF generator, wherein the third RF generator has a higher operating frequency than the first RF generator;
      receive a voltage signal having a frequency of the first RF signal;
      divide the voltage signal into a first number of bins that is different from a second number of bins, wherein the second number of bins is generated when the third RF generator is used.

8. A plasma chamber comprising:
   a top electrode; and
   a chuck facing the top electrode, wherein the chuck includes:
      a dielectric layer having a bottom surface; and
      a base metal layer, wherein the dielectric layer is located on top of the base metal layer, wherein the base metal layer has a porous plug, wherein the bottom surface of the dielectric layer has a portion that is in contact with the porous plug,
   wherein the chuck is configured to be coupled to a first RF transmission line to receive a first modified RF signal having a first frequency that ranges between 10 kilohertz (kHz) and 330 kHz, wherein the dielectric layer has a thickness less than a thickness of a conventional dielectric layer that is configured to be coupled to a conventional RF generator having a frequency of operation that is greater than the first frequency.

9. The plasma chamber of claim 8, wherein the first RF transmission line is coupled via a first impedance matching circuit to a first RF generator, wherein the first RF generator has a frequency of operation that ranges between 10 kHz and 330 kHz.

10. The plasma chamber of claim 9, further comprising:
    an edge electrode that surrounds the chuck,
    wherein the edge electrode is configured to be coupled to a second RF transmission line to receive a second modified RF signal having a frequency that ranges between 10 kHz and 330 kHz.

11. The plasma chamber of claim 10, wherein the second RF transmission line is coupled via a second impedance matching circuit to a second RF generator, wherein the second RF generator has a frequency of operation that ranges between 10 kHz and 330 kHz.

12. The plasma chamber of claim 11, wherein a phase of the first modified RF signal is within a pre-set range from a phase of the second modified RF signal.

13. The plasma chamber of claim 11, wherein the first frequency of the first modified RF signal is within a pre-determined range from a second frequency of the second modified RF signal.

14. The plasma chamber of claim 8, wherein the dielectric layer excludes any porous plugs, wherein the first RF transmission line is coupled via a first impedance matching circuit to a first RF generator, wherein the first RF generator has an operating frequency range from 90 kHz to 110 kHz, wherein the thickness of the dielectric layer ranges from 0.7 millimeters to 0.9 millimeters.

15. A method comprising:
generating a first radio frequency (RF) signal, wherein the first RF signal is generated by a first RF generator that has an operating frequency range between 10 kilohertz (kHz) and 330 kHz;
modifying an impedance of the first RF signal to output a first modified RF signal; and
receiving, by a lower electrode of a chuck, the first modified RF signal via a base metal layer of the chuck and a portion of a first dielectric layer of the chuck,
wherein the first dielectric layer is located on top of the base metal layer,
wherein the first dielectric layer has a bottom surface, wherein the first dielectric layer has a thickness less than a thickness of a conventional dielectric layer that is configured to be coupled to a conventional RF generator having an operating frequency greater than the operating frequency range,
wherein the base metal layer has a porous plug, wherein the bottom surface of the first dielectric layer has a portion that is in contact with the porous plug.

16. The method of claim 15, wherein the first dielectric layer excludes any porous plugs, wherein the operating frequency range is from 90 kHz to 110 kHz, wherein the thickness of the dielectric layer ranges from 0.7 millimeters to 0.9 millimeters.

17. The method of claim 15, further comprising:
generating, by a second RF generator, a second RF signal, wherein the second RF generator has an operating frequency range between 10 kHz and 330 kHz;
receiving the second RF signal and modifying an impedance of the second RF signal to output a second modified RF signal;
receiving, by an edge ring, the second modified RF signal, wherein the edge ring surrounds the chuck.

18. The method of claim 17, further comprising:
controlling the second modified RF signal to have a frequency that is within a pre-determined range from a frequency of the first modified RF signal;
controlling the second modified RF signal to achieve a phase to be within a pre-set range from a phase of the first modified RF signal; and
controlling the second RF generator to achieve a voltage setpoint.

19. The method of claim 18, wherein the pre-determined range is achieved when the frequencies of the first and second RF modified RF signals are the same.

20. The method of claim 18, wherein the pre-set range is achieved when the phases of the first and second modified RF signals are the same.

* * * * *